United States Patent
Seto

(10) Patent No.: US 11,575,822 B2
(45) Date of Patent: Feb. 7, 2023

(54) PHOTOELECTRIC CONVERSION APPARATUS, PHOTOELECTRIC CONVERSION SYSTEM, AND MOVING BODY

(71) Applicant: CANON KABUSHIKI KAISHA, Tokyo (JP)

(72) Inventor: Daichi Seto, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/506,127

(22) Filed: Oct. 20, 2021

(65) Prior Publication Data

US 2022/0132044 A1    Apr. 28, 2022

(30) Foreign Application Priority Data

Oct. 28, 2020  (JP) .............................. JP2020-180629

(51) Int. Cl.
*H04N 5/232*      (2006.01)
*H01L 27/146*     (2006.01)
*H04N 5/369*      (2011.01)

(52) U.S. Cl.
CPC . *H04N 5/232122* (2018.08); *H01L 27/14627* (2013.01); *H04N 5/36961* (2018.08)

(58) Field of Classification Search
CPC ......... H04N 5/232122; H04N 5/36961; H04N 5/232941; H04N 5/374; H01L 27/14627; H01L 27/14603; H01L 27/1461; H01L 27/14614; H01L 27/14641
See application file for complete search history.

(56) References Cited

U.S. PATENT DOCUMENTS

| | | | |
|---|---|---|---|
| 9,773,827 B2* | 9/2017 | Minowa | H01L 27/14612 |
| 2004/0100570 A1* | 5/2004 | Shizukuishi | H04N 9/04557 348/E9.01 |
| 2009/0030337 A1 | 1/2009 | Gozani | |
| 2011/0156104 A1* | 6/2011 | Yamaguchi | H01L 27/1464 257/222 |
| 2015/0358569 A1 | 12/2015 | Egawa | |
| 2017/0359539 A1* | 12/2017 | Kawabata | H01L 27/14643 |
| 2020/0312893 A1* | 10/2020 | Seto | G06T 7/55 |

FOREIGN PATENT DOCUMENTS

| | | |
|---|---|---|
| JP | 2008028105 A | 2/2008 |
| JP | 2014075393 A | 4/2014 |
| JP | 2018117178 A | 7/2018 |

* cited by examiner

*Primary Examiner* — Shahbaz Nazrul

(74) *Attorney, Agent, or Firm* — Canon U.S.A., Inc. IP Division

(57) ABSTRACT

A substrate including a first surface and a second surface, a first region of a first conductivity type disposed at a first depth, a second region of the first conductivity type disposed at the first depth and separated from the first region, a third region of the first conductivity type disposed at a second depth shallower than the first depth, a first gate, a second gate, a third gate, and a microlens disposed such that transmitted light is incident on the first region, the second region, and the third region. Signal charges accumulated in the first region are read out through the third region and an impurity concentration of each of the first region and the second region is lower than an impurity concentration of the third region.

19 Claims, 22 Drawing Sheets

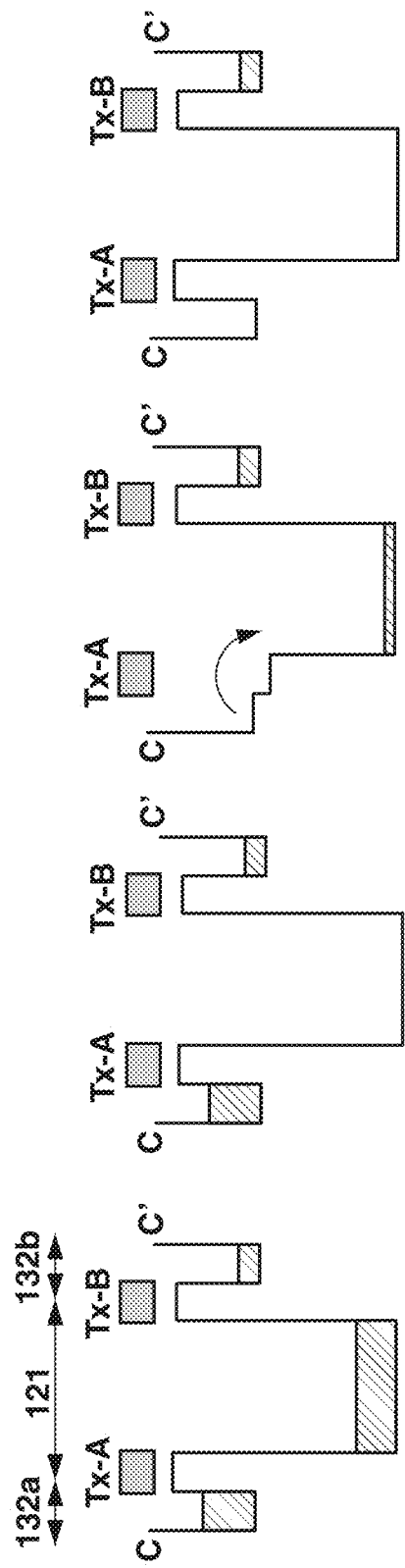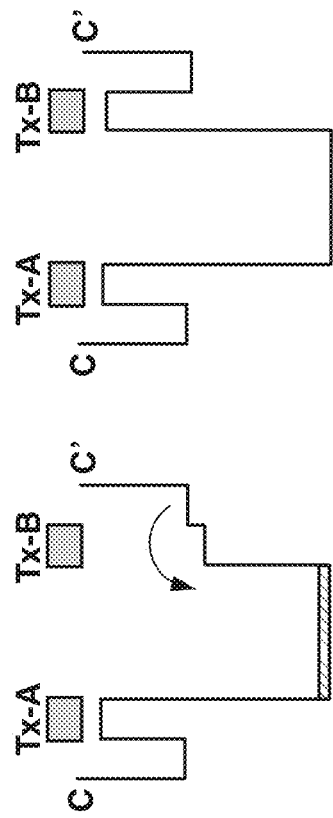

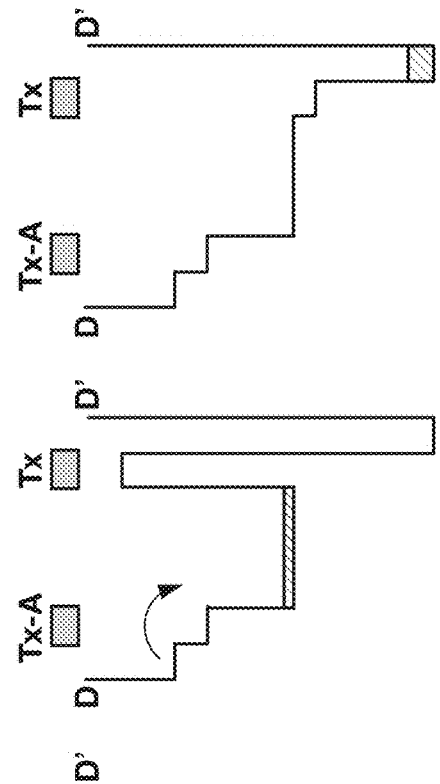 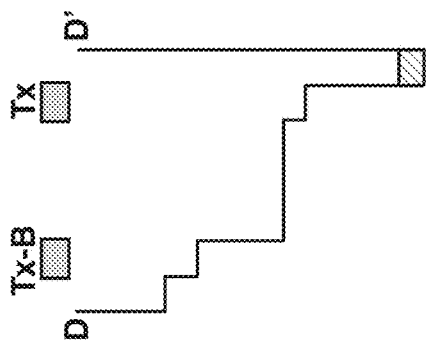 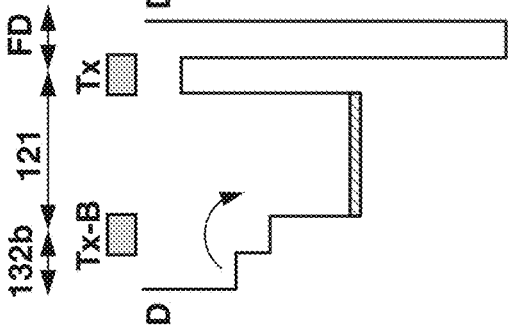

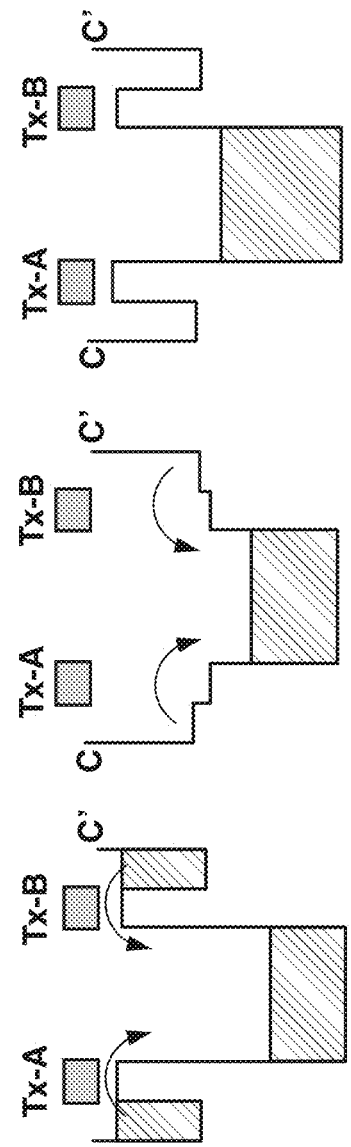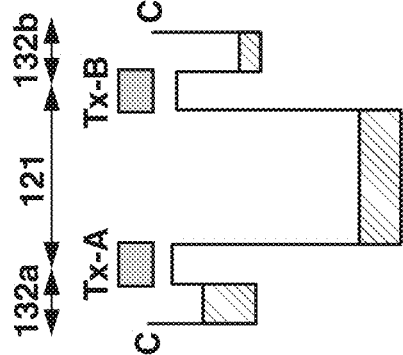

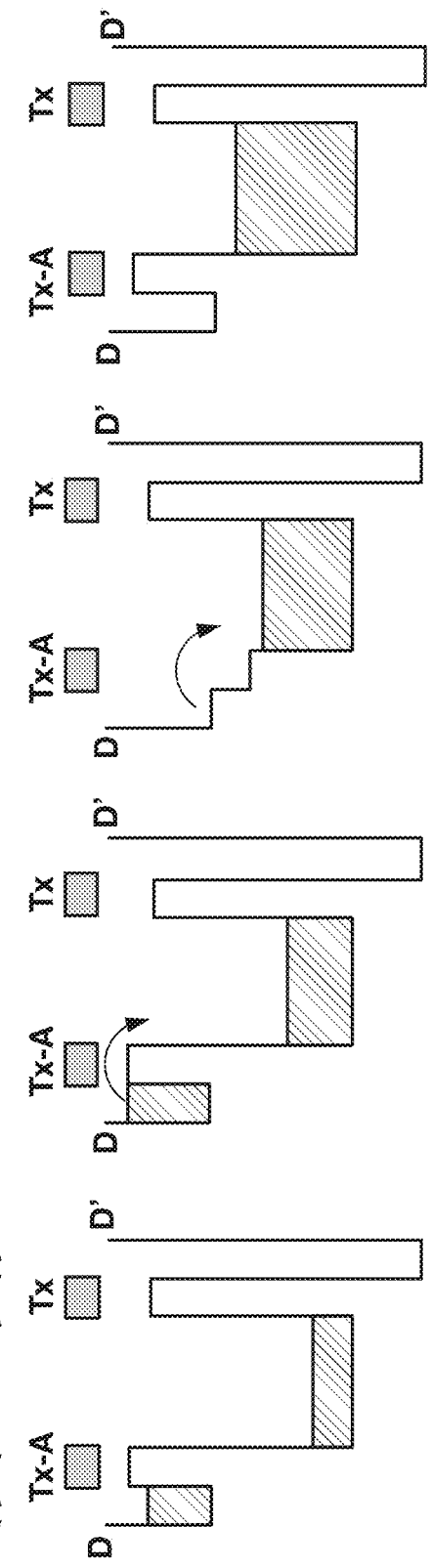

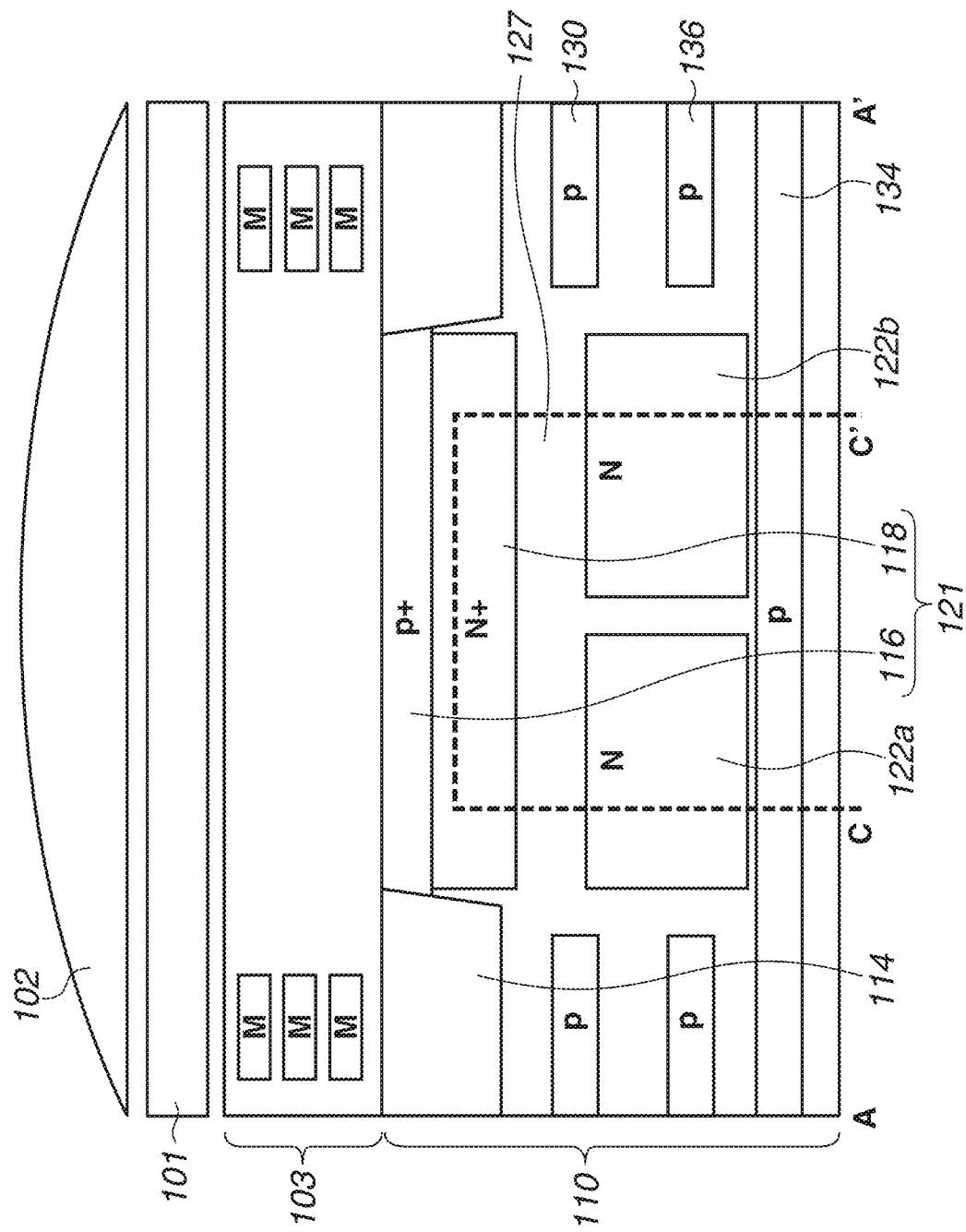

FIG.20B
FRONT VIEW
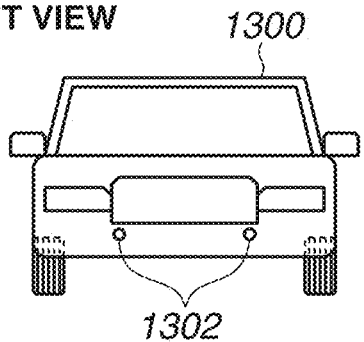
TOP VIEW
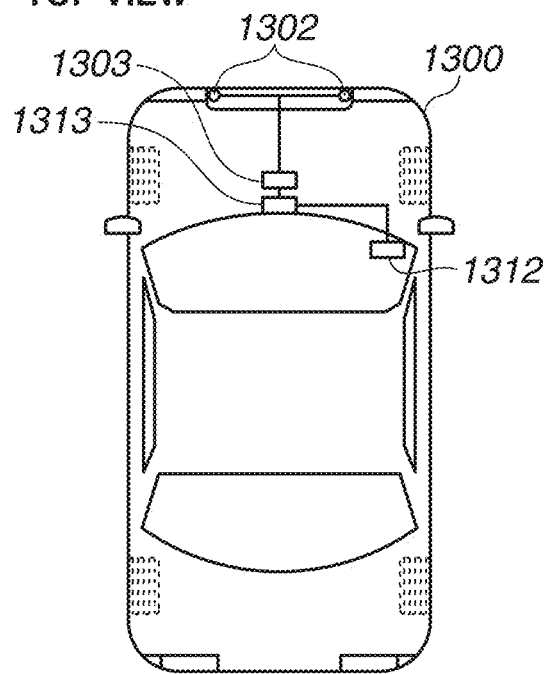
REAR VIEW
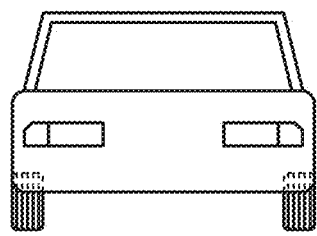

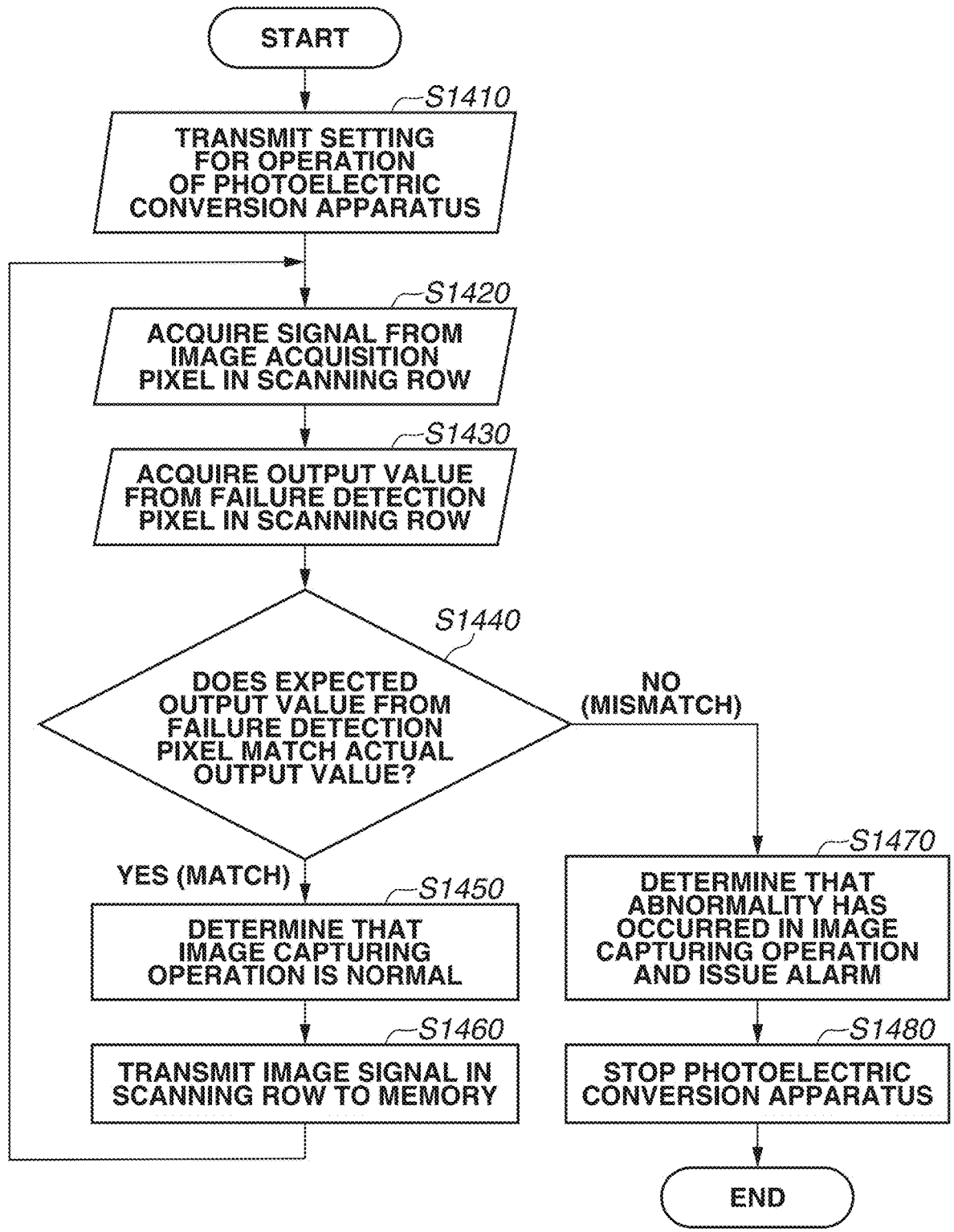

PHOTOELECTRIC CONVERSION APPARATUS, PHOTOELECTRIC CONVERSION SYSTEM, AND MOVING BODY

BACKGROUND OF THE DISCLOSURE

Field

The aspect of the embodiments relates to a photoelectric conversion apparatus, a photoelectric conversion system, and a moving body.

Description of the Related Art

As a technique of an auto focus (AF) method in a digital camera and the like, a photoelectric conversion apparatus that performs AF using a phase difference method is known. Japanese Patent Application Laid-Open No. 2008-28105 discusses a configuration in which a plurality of photoelectric conversion apparatuses that perform AF using the phase difference method is disposed for a single microlens. Japanese Patent Application Laid-Open No. 2008-28105 also discusses a technique in which an electric charge accumulation layer for image capturing is disposed in a shallow portion of a semiconductor substrate and a plurality of electric charge accumulation layers for focus detection is disposed in a deep portion of the semiconductor substrate in such a manner that the electric charge accumulation layers for focus detection overlap the electric charge accumulation layer for image capturing.

In the configuration discussed in Japanese Patent Application Laid-Open No. 2008-28105, the electric charge accumulation layer for image capturing is fully separated from the electric charge accumulation layer for focus detection. Accordingly, if electric charges more than a saturation charge amount are generated in the electric charge accumulation layer for focus detection, crosstalk may occur between pixels, which may lead to deterioration in the accuracy of focus detection. Additionally, if the amount of signal charges accumulated in the electric charge accumulation layer for focus detection exceeds the saturation charge amount, the excess signal charges cannot be detected as signals.

SUMMARY

According to an aspect of the embodiments, an apparatus includes a substrate including a first surface and a second surface opposed to the first surface, a first region of a first conductivity type disposed at a first depth from the first surface in the substrate, carriers having a conductivity type same as a conductivity type of signal carriers being used as major carriers in the first region, a second region of the first conductivity type disposed at the first depth in the substrate, the second region being separated from the first region, a third region of the first conductivity type disposed at a second depth in the substrate, the second depth being shallower than the first depth from the first surface, a first gate configured to control transfer of signal charges accumulated in the first region, a second gate configured to control transfer of signal charges accumulated in the second region, a third gate configured to control transfer of signal charges accumulated in the third region, and a microlens disposed such that light transmitted through the microlens is incident on the first region, the second region, and the third region, wherein the signal charges accumulated in the first region are read out through the third region, and wherein an impurity concentration of each of the first region and the second region is lower than an impurity concentration of the third region.

According to another aspect of the embodiments, a method for an apparatus, the apparatus including a substrate including a first surface and a second surface opposed to the first surface, a first region of a first conductivity type disposed at a first depth from the first surface in the substrate, carriers having a conductivity type same as a conductivity type of signal carriers being used as major carriers in the first region, a second region of the first conductivity type disposed at the first depth in the substrate, a third region of the first conductivity type disposed at a second depth in the substrate, the second depth being shallower than the first depth from the first surface, a floating diffusion region, a first gate configured to control transfer of signal charges accumulated in the first region, a second gate configured to control transfer of signal charges accumulated in the second region, a third gate configured to control transfer of signal charges accumulated in the third region, and a microlens disposed such that light transmitted through the microlens is incident on the first region and the second region, the method including transferring, in a case where an amount of signal charges accumulated in the first region and an amount of signal charges accumulated in the second region are less than or equal to a predetermined value, the signal charges accumulated in the first region and the signal charges accumulated in the second region after the third gate is turned on to transfer the signal charges from the third region to the floating diffusion region.

Further features of the disclosure will become apparent from the following description of exemplary embodiments with reference to the attached drawings.

BRIEF DESCRIPTION OF THE DRAWINGS

FIGS. 7A to 7F are potential diagrams of the photoelectric conversion apparatus according to the first exemplary embodiment.

FIGS. 8A to 8F are potential diagrams of the photoelectric conversion apparatus according to the first exemplary embodiment.

FIGS. 10A to 10H are potential diagrams of the photoelectric conversion apparatus according to the first exemplary embodiment.

FIGS. 11A to 11H are potential diagrams of the photoelectric conversion apparatus according to the first exemplary embodiment.

FIG. 12 is a sectional view illustrating another example of the photoelectric conversion apparatus according to the first exemplary embodiment.

FIG. 20B is a schematic view illustrating a configuration example of a moving body according to the sixth exemplary embodiment.

FIG. 21 is a flowchart illustrating processing to be executed by the photoelectric conversion system according to the sixth exemplary embodiment.

DESCRIPTION OF THE EMBODIMENTS

Figure 1:
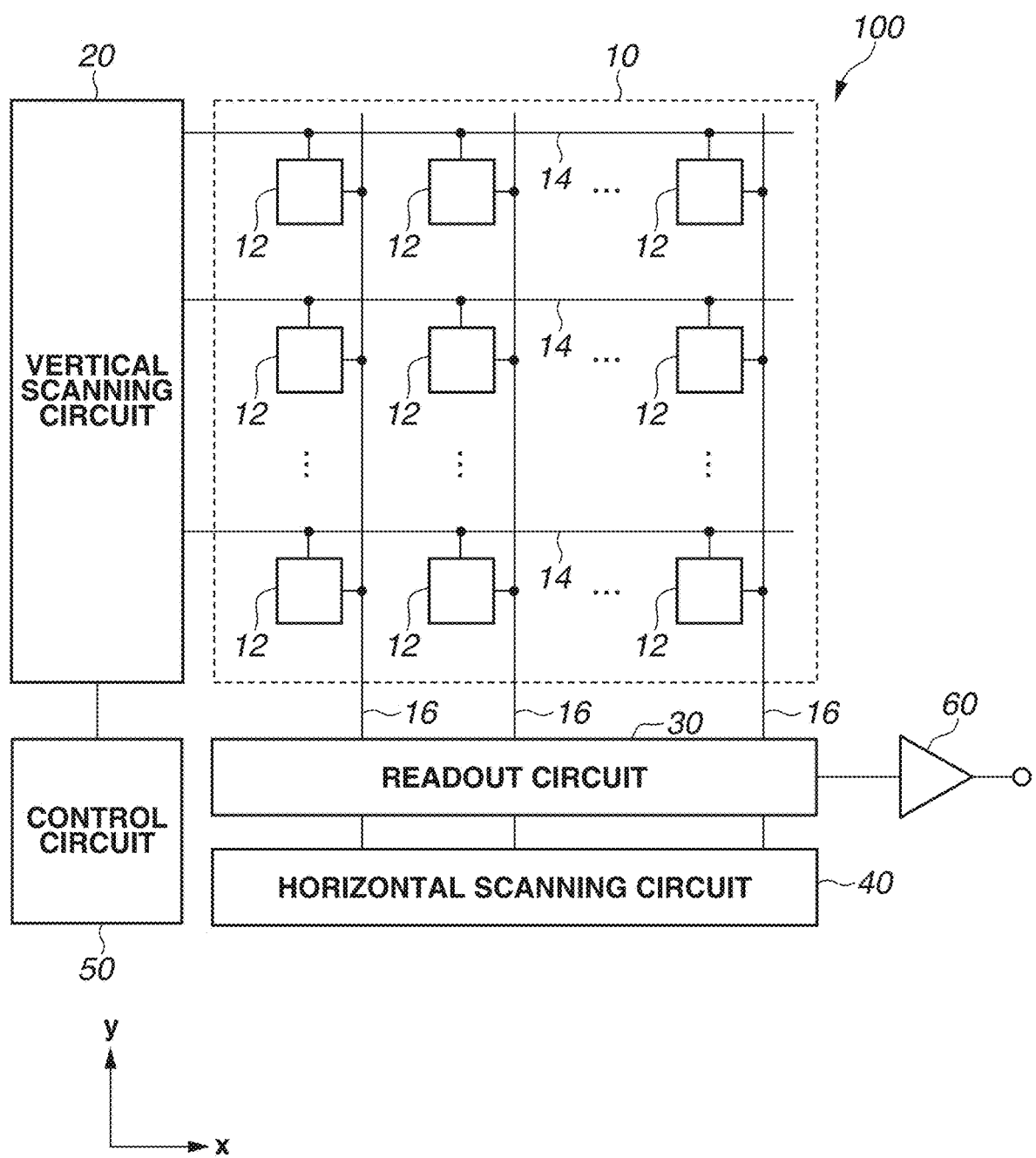
FIG. 1 is a block diagram illustrating a schematic configuration of a photoelectric conversion apparatus according to a first exemplary embodiment.

The following exemplary embodiments are exemplified to embody the technical idea of the disclosure, and are not intended to limit the disclosure. The sizes and positional relationships of members illustrated in the drawings may be exaggerated for clarity of the explanation. In the following description, the same components are denoted by the same reference numerals, and descriptions thereof may be omitted.

In the following description, assume that a semiconductor region of a first conductivity type in which carriers having the same conductivity type as signal carriers are used as major carriers is an n-type semiconductor region and a semiconductor region of a second conductivity type is a p-type semiconductor region. The aspect of the embodiments can be attained also in a case where signal charges are holes. In this case, the semiconductor region of the first conductivity type in which carriers having the same conductivity type as signal carriers are used as major carriers is the p-type semiconductor region, and the semiconductor region of the second conductivity type is the n-type semiconductor region.

The term "impurity concentration" used herein refers to a net impurity concentration, i.e., a concentration of an impurity that is compensated for by a reverse conductivity type impurity. The region in which the concentration of a p-type additive impurity is higher than the concentration of an n-type additive impurity corresponds to the p-type semiconductor region. The region in which the concentration of an n-type additive impurity is higher than the concentration of a p-type additive impurity corresponds to the n-type semiconductor region.

The term "plan view" used herein refers to a view in a direction perpendicular to a light incident surface of a semiconductor substrate to be described below. The term "section" used herein refers to a surface perpendicular to the light incident surface of the semiconductor substrate. If the light incident surface of the semiconductor substrate is a rough surface when the surface is microscopically viewed, the plan view is defined based on the light incident surface of the semiconductor substrate as macroscopically viewed.

Figure 2:
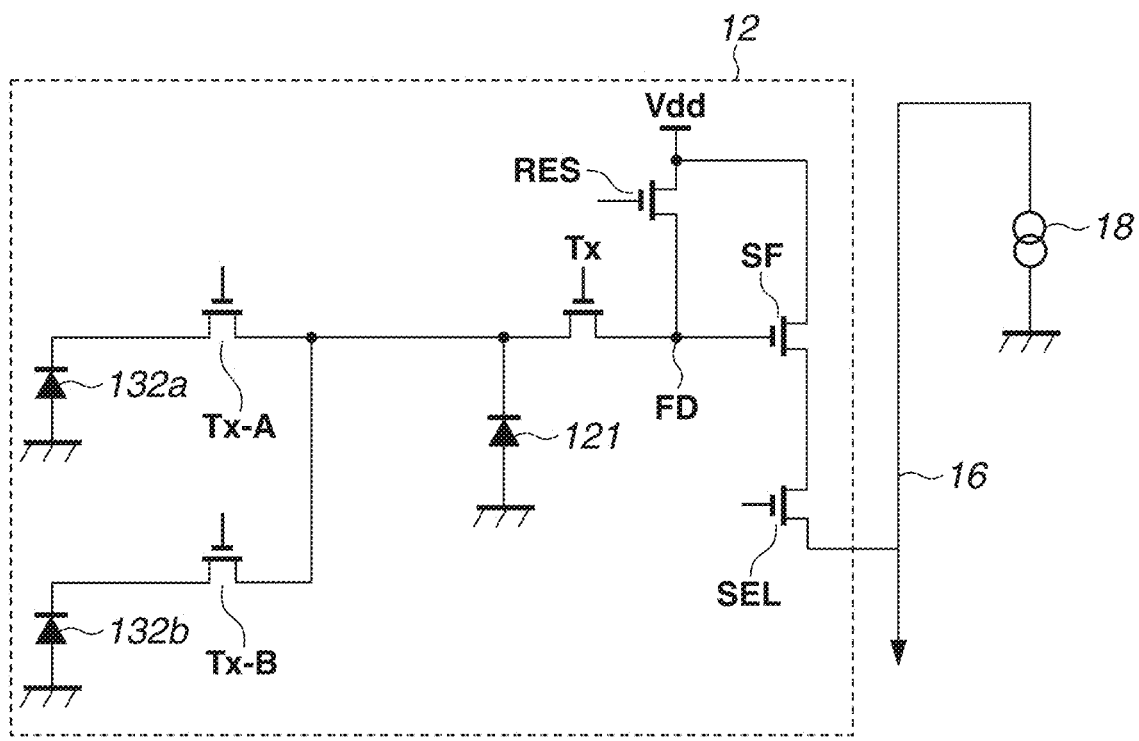
FIG. 2 is an equivalent circuit diagram illustrating a unit cell of the photoelectric conversion apparatus according to the first exemplary embodiment.
Figure 3:
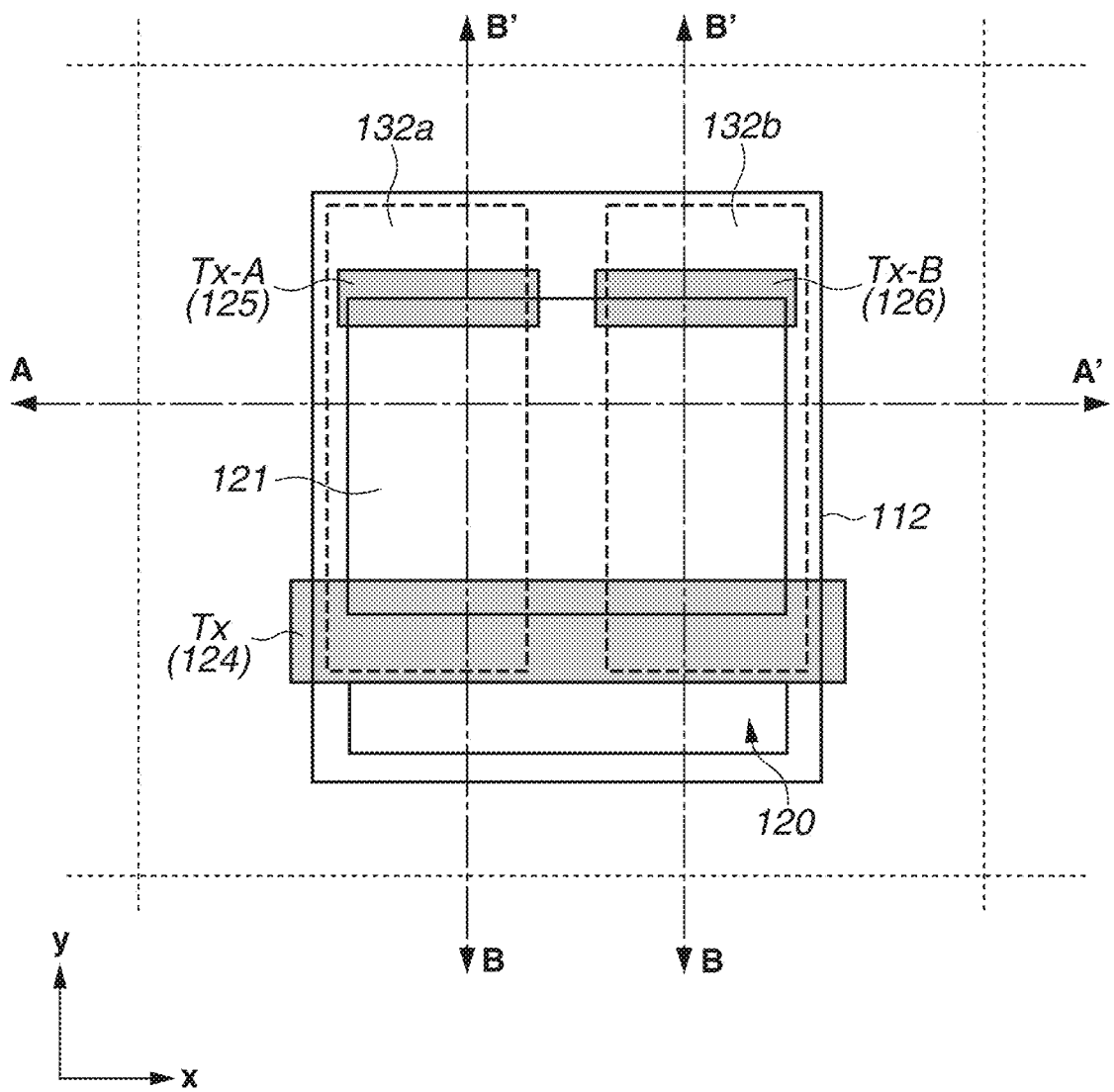
FIG. 3 is a plan view illustrating the unit cell of the photoelectric conversion apparatus according to the first exemplary embodiment.
Figure 4:
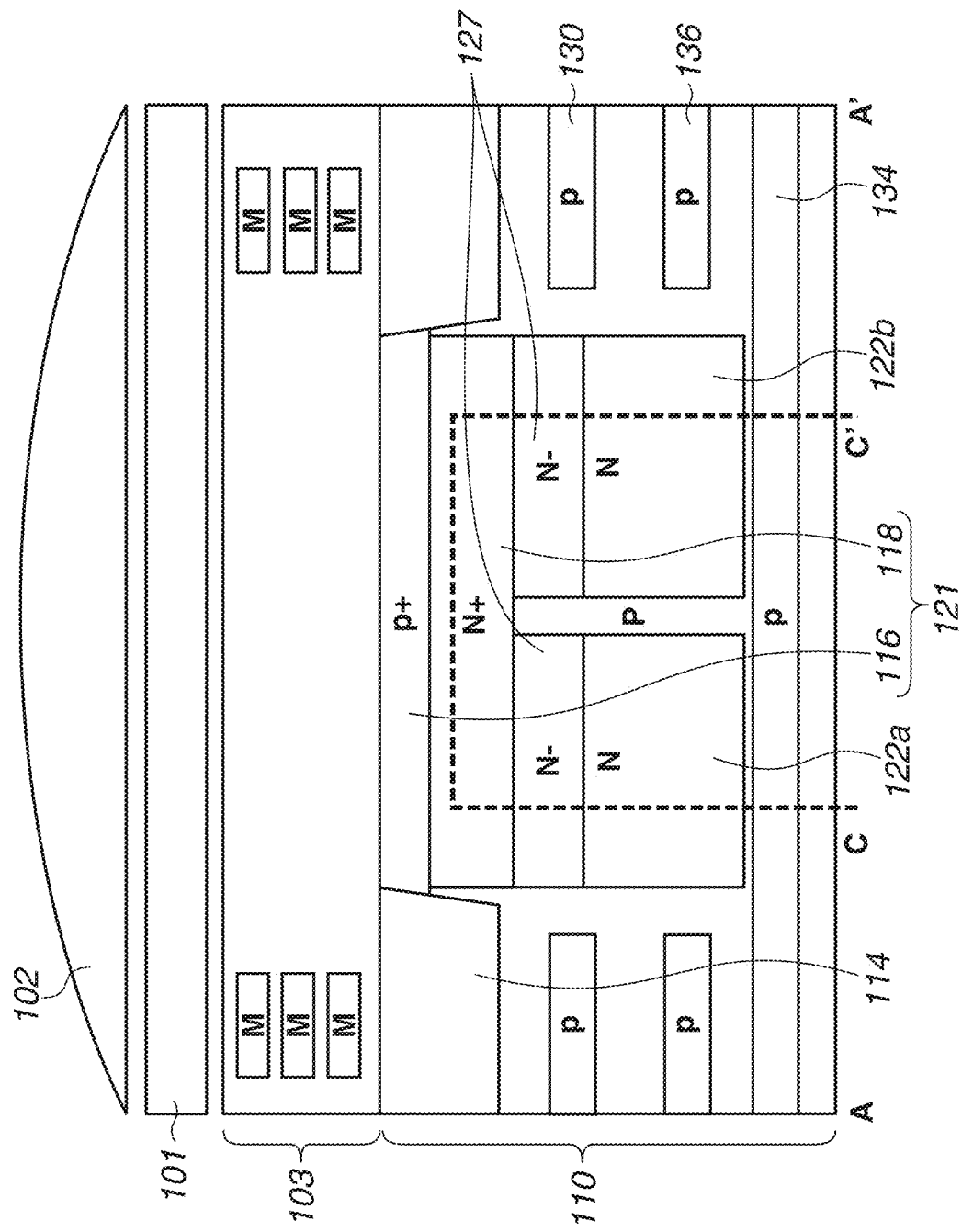
FIG. 4 is a sectional view illustrating the photoelectric conversion apparatus according to the first exemplary embodiment.
Figure 5:
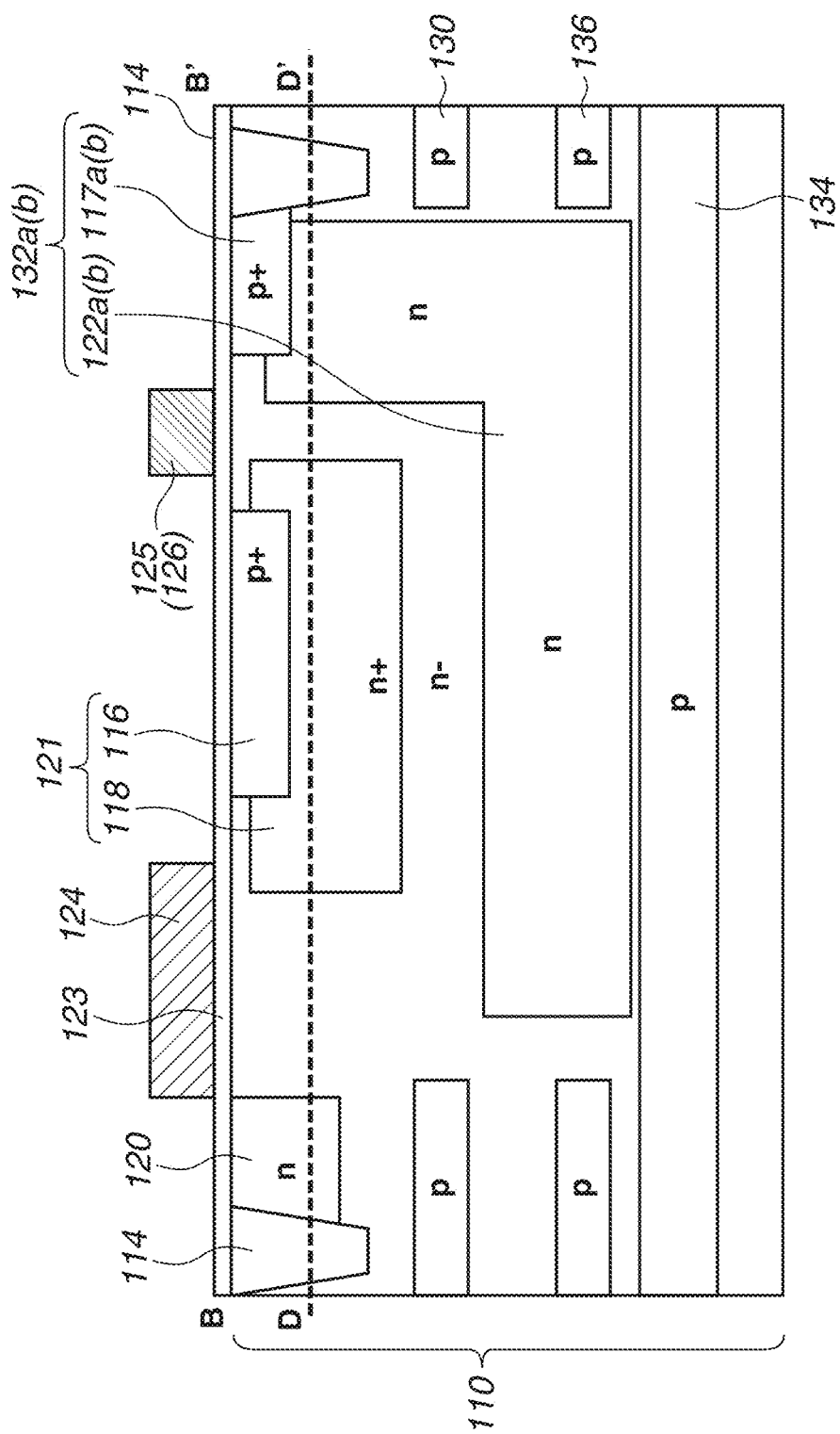
FIG. 5 is a sectional view illustrating the photoelectric conversion apparatus according to the first exemplary embodiment.
Figure 6:
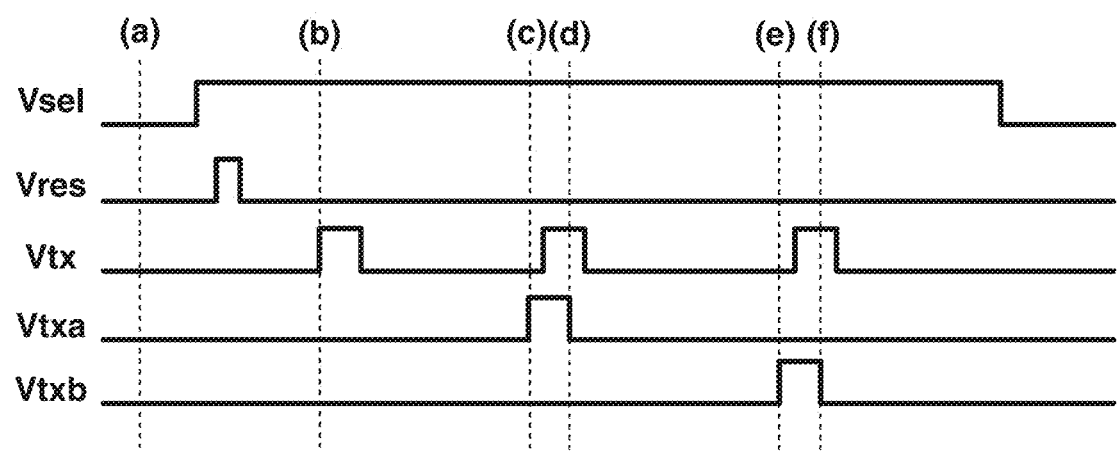
FIG. 6 is a clock timing diagram illustrating a readout operation of the photoelectric conversion apparatus according to the first exemplary embodiment.
Figure 9:
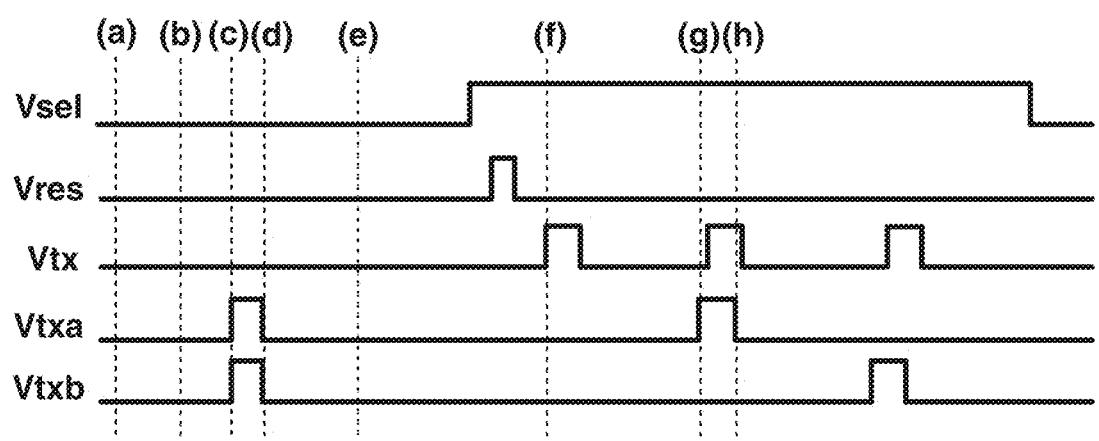
FIG. 9 is a clock timing diagram illustrating the readout operation of the photoelectric conversion apparatus according to the first exemplary embodiment.

A photoelectric conversion apparatus according to a first exemplary embodiment of the disclosure will be described with reference to FIGS. 1 to 11H. FIG. 1 is a block diagram illustrating a schematic configuration of the photoelectric conversion apparatus according to the present exemplary embodiment. FIG. 2 is an equivalent circuit diagram illustrating a pixel included in the photoelectric conversion apparatus according to the present exemplary embodiment. FIG. 3 is an enlarged plan view illustrating a schematic configuration of a pixel included in the photoelectric conversion apparatus according to the present exemplary embodiment. FIG. 4 is a schematic sectional view taken along a line A-A' illustrated in FIG. 3. FIG. 5 is a schematic sectional view taken along a line B-B' illustrated in FIG. 3. FIG. 6 is a timing diagram illustrating a readout operation. FIG. 6 illustrates a case where the amount of signal charges to be generated is less than or equal to a predetermined value. The predetermined value is, for example, a saturation charge amount of photoelectric conversion elements 132$a$ and 132$b$. FIGS. 7A to 7F and FIGS. 8A to 8F are potential diagrams illustrating the signal charge accumulation operation and the signal charge transfer operation of the photoelectric conversion apparatus in each configuration illustrated in FIG. 6. FIG. 9 is a timing diagram illustrating the readout operation when the predetermined value is exceeded. FIG. 9 illustrates an example where signals are read out under a high illuminance. FIGS. 10A to 10H and FIGS. 11A and 11H are potential diagrams illustrating the signal charge accumulation operation and the signal charge transfer operation of the photoelectric conversion apparatus in each configuration illustrated in FIG. 9.

As illustrated in FIG. 1, a photoelectric conversion apparatus 100 according to the present exemplary embodiment includes a pixel region 10, a vertical scanning circuit 20, a readout circuit 30, a horizontal scanning circuit 40, a control circuit 50, and an output circuit 60.

In the pixel region 10, a plurality of pixels 12 is arranged in a matrix of a plurality of rows and a plurality of columns. In each row of a pixel array in the pixel region 10, a control signal line 14 is disposed and extends in a row direction (lateral direction in FIG. 1). Each control signal line 14 is connected to the pixels 12 arranged in the row direction and is used as a common signal line for these pixels 12. In each column of the pixel array in the pixel region 10, a vertical output line 16 is disposed and extends in a column direction (vertical direction in FIG. 1). Each vertical output line 16 is connected to the pixels 12 arranged in the column direction and is used as a common signal line for these pixels 12.

The control signal line 14 in each row is connected to the vertical scanning circuit 20. The vertical scanning circuit 20 is a circuit portion that supplies each pixel 12 with a control signal for driving the readout circuit in the pixel 12 when a pixel signal is read out from the pixel 12, through the corresponding control signal line 14. One end of the vertical output line 16 in each column is connected to the readout circuit 30. The pixel signal read out from the pixel 12 is input to the readout circuit 30 through the corresponding vertical output line 16. The readout circuit 30 is a circuit portion that performs predetermined signal processing, such as amplification processing or analog-to-digital (AD) conversion processing, on the pixel signal read out from the pixel 12. The readout circuit 30 can include a differential amplification circuit, a sample-and-hold circuit, and an AD conversion circuit.

The horizontal scanning circuit 40 is a circuit portion that supplies the readout circuit 30 with control signals for sequentially transferring to the output circuit 60, for each column, pixel signals processed in the readout circuit 30. The control circuit 50 is a circuit portion that supplies control signals for controlling the operation and timing of each of the vertical scanning circuit 20, the readout circuit 30, and the horizontal scanning circuit 40. The output circuit 60 is a circuit portion that is composed of a buffer amplifier, a differential amplifier, or the like, and outputs the pixel signals read out from the readout circuit 30 to an external signal processing unit of the photoelectric conversion apparatus 100.

Components in the pixel region 10 and a peripheral circuit region may be disposed separately on a plurality of stacked semiconductor substrates. For example, a first semiconductor substrate and a second semiconductor substrate may be stacked. In this case, the first semiconductor substrate may be provided with the pixel region 10, and the second semiconductor substrate may be provided with the vertical scanning circuit 20, the control circuit 50, the readout circuit 30, the horizontal scanning circuit 40, and the output circuit 60.

FIG. 2 is an equivalent circuit diagram illustrating the pixel 12 of the photoelectric conversion apparatus according to the present exemplary embodiment. The pixel 12 includes a photoelectric conversion element 121, a transfer transistor Tx, the photoelectric conversion elements 132a and 132b, transfer transistors Tx-A and Tx-B, a reset transistor RES, an amplification transistor SF, and a selection transistor SEL. The photoelectric conversion elements 121, 132a, and 132b are, for example, photodiodes. Anodes of the photoelectric conversion elements 121, 132a, and 132b are each connected to a ground voltage line, and cathodes of the photoelectric conversion elements 121, 132a, and 132b are connected to the sources of the transfer transistors Tx, Tx-A, and Tx-B, respectively. The drain of the transfer transistor Tx is connected to the source of the reset transistor RES and the gate of the amplification transistor SF. A connection node at which the drain of the transfer transistor Tx, the source of the reset transistor RES, and the gate of the amplification transistor SF are connected is a so-called floating diffusion (FD), which forms a charge voltage conversion portion formed of a capacitance component included in the connection node. The drain of each of the transfer transistors Tx-A and Tx-B is connected to the cathode of the photoelectric conversion element 121. The drain of the reset transistor RES and the drain of the amplification transistor SF are each connected to a power voltage line (Vdd). The source of the amplification transistor SF is connected to the drain of the selection transistor SEL. The source of the selection transistor SEL is connected to the vertical output line 16. The other end of the vertical output line 16 is connected to a current source 18. The selection transistor SEL need not necessarily be included in the pixel 12. In this case, signals are directly output from the amplification transistor SF to the vertical output line 16.

FIG. 3 is a schematic plan view illustrating a layout of the pixel 12. FIG. 3 illustrates only the planar layout of a single pixel 12. However, the planar layout illustrated in FIG. 2 is periodically disposed at a predetermined unit pixel pitch in the horizontal direction and the vertical direction in the actual implementation. Although not illustrated in FIG. 3, each pixel 12 includes the above-described transistors, and microlenses respectively corresponding to the pixels 12 are disposed.

For example, a semiconductor substrate, such as silicon, is used as a semiconductor substrate 110. For example, an n-type semiconductor substrate with a low impurity concentration is used. On a surface portion of the semiconductor substrate 110, an element isolation 114 for defining an active region 112 is provided. In the configuration illustrated in FIG. 3, a shallow trench isolation (STI) serving as an insulating region is provided as the element isolation 114, but instead a deep trench isolation (DTI) or p-type semiconductor region may be used as the element isolation 114.

As illustrated in FIG. 3, the active region 112 includes the photoelectric conversion elements 121, 132a, and 132b and an FD region 120. For example, the photoelectric conversion element 121 is used as a photoelectric conversion element for image capturing, and the photoelectric conversion elements 132a and 132b are used as photoelectric conversion elements for focus detection. In the active region 112, a charge transfer portion including a transfer gate 124 (third transfer gate) is disposed between the photoelectric conversion element 121 and the FD region 120 in a planar view. In the active region 112, an n-type semiconductor region 127 is disposed between the photoelectric conversion element 121 and the photoelectric conversion element 132a and between the photoelectric conversion element 121 and the photoelectric conversion element 132b. In a planar view, the active region 112 includes a transfer gate 125 (first transfer gate) for controlling transfer of signal charges accumulated in the photoelectric conversion element 132a, and a transfer gate 126 (second transfer gate) for controlling transfer of signal charges accumulated in the photoelectric conversion element 132b. The photoelectric conversion element 121 is shared between the photoelectric conversion element 132a and the photoelectric conversion element 132b.

The transfer gate 124, which is the gate of the transfer transistor Tx, controls transfer of signal charges generated in the photoelectric conversion element 121 to the FD region 120. The transfer gate 125 controls transfer of signal charges accumulated in the photoelectric conversion element 132a to the photoelectric conversion element 121. The transfer gate 126 controls transfer of signal charges accumulated in the photoelectric conversion element 132b to the photoelectric conversion element 121.

While FIG. 3 illustrates only one photoelectric conversion unit for convenience of explanation, the pixel region 10 is formed of a large number of pixels 12 that are arranged in a matrix.

FIG. 4 is a schematic sectional view taken along the line A-A' illustrated in FIG. 3. FIG. 5 is a schematic sectional view taken along the line B-B' illustrated in FIG. 3. In FIG. 3, the configuration taken along the line B-B' that passes through the transfer transistor Tx-A is substantially the same as the configuration taken along the line B-B' that passes through the transfer transistor Tx-B, except for the layout positions. Accordingly, these configurations will be described with reference to one figure, i.e., FIG. 5. FIG. 5 mainly illustrates the configuration taken along the line B-B' that passes through the transfer transistor Tx-A, and the configuration taken along the line B-B' that passes through the transfer transistor Tx-B is illustrated in parentheses. The components common to the both configurations are not in parenthesis.

FIG. 4 also illustrates a color filter 101, a microlens 102, and wiring layers 103, which are disposed at positions overlapping the semiconductor substrate 110 in a planar view. FIG. 4 illustrates three wiring layers 103 that are disposed at different heights. Each wiring layer 103 includes a wire M and an insulating material. In one embodiment, the color filter 101 is disposed such that light to be incident on the photoelectric conversion elements 132a and 132b is transmitted through the color filter of the same color. Instead of providing the color filter, the photoelectric conversion apparatus according to the present exemplary embodiment may be used as a monochromatic photoelectric conversion apparatus.

As illustrated in FIG. 4, the semiconductor substrate 110 includes a first surface and a second surface opposed to the first surface. The first surface is also referred to as a front surface, and the second surface is also referred to as a back surface. The present exemplary embodiment illustrates a front surface incidence type photoelectric conversion apparatus on which light is incident from the first surface, but instead a back surface irradiation type photoelectric conversion apparatus on which light is incident from the second surface as described below in the following exemplary embodiment may be used.

As illustrated in FIG. 4, the microlenses 102 respectively corresponding to the pixels 12 are provided on the front surface. Each pixel 12 includes a plurality of photoelectric conversion elements. The configuration illustrated in FIG. 3 includes three photoelectric conversion elements 121, 132a, and 132b. Alternatively, four photoelectric conversion elements or nine photoelectric conversion elements may be included in a single photoelectric conversion unit.

The following exemplary embodiment illustrates a configuration in which each pixel 12 includes a plurality of photoelectric conversion elements and a single microlens 102 is disposed for each pixel 12. However, the aspect of the embodiments is not limited to this configuration. For example, a configuration in which each pixel 12 includes a single photoelectric conversion element and a single microlens 102 is disposed for two or more pixels 12 is also included in the disclosure. In other words, there is no need to determine the layout of the microlenses 102 based on the pixels 12, and any configuration in which a single microlens is disposed for a plurality of photoelectric conversion elements is included in the disclosure. In addition, there is no need to use all pixels in the pixel region 10 to carry out the disclosure, as long as the pixels that are thinned out in the pixel region 10 and used to carry out the disclosure are included.

The photoelectric conversion element 121 includes an n-type semiconductor region 118 (third semiconductor region) and a p-type semiconductor region 116. Specifically, the n-type semiconductor region 118 and the p-type semiconductor region 116 form the photoelectric conversion element 121 as a buried photodiode. The n-type semiconductor region 118 is a region that has a low potential for electrons and collects signal charges.

The photoelectric conversion element 132a includes an n-type semiconductor region 122a and a p-type semiconductor region 117a. Similarly, the photoelectric conversion element 132b includes an n-type semiconductor region 122b and a p-type semiconductor region 117b.

Light focused by the microlens 102 is incident on each of the photoelectric conversion elements 121, 132a, and 132b.

The gate electrode 124 included in the transfer transistor Tx is disposed between the n-type semiconductor region 118 and the n-type semiconductor region that forms the FD region 120 in a planar view. The gate electrode 124 is provided through a gate insulating film 123 on the semiconductor substrate 110. The gate electrode 124 is a flat transfer gate. In other words, the gate electrode 124 is not buried in the semiconductor substrate 110 and is disposed on the front surface of the semiconductor substrate 110.

P-type semiconductor regions 130, 136, and 134 are disposed at positions that are deeper than the position of each of the n-type semiconductor region 118 and the FD region 120 in the semiconductor substrate 110.

The term "depth direction" used herein refers to the direction from the first surface to the second surface.

The p-type semiconductor region 130 electrically isolates the adjacent pixels 12 in the semiconductor substrate 110. The p-type semiconductor region 136 electrically isolates the adjacent pixels 12 at a position that is deeper than the position of the p-type semiconductor region 130 in the semiconductor substrate 110. The p-type semiconductor region 134 has a function for defining the depth at which signal charges generated in the semiconductor substrate 110 due to the incidence of light can be effectively collected. In an orthogonal projection on the front surface of the semiconductor substrate 110, the p-type semiconductor region 134 is disposed to overlap a region including all of the n-type semiconductor region 118, the p-type semiconductor region 116, the FD region 120, and the transfer gates 124 and 125. As illustrated in FIG. 3, in the orthogonal projection on the front surface of the semiconductor substrate 110, the p-type semiconductor region 134 may be disposed on the entire area of each pixel 12. An impurity concentration of each of the p-type semiconductor regions 130, 136, and 134 may be lower than an impurity concentration of the p-type semiconductor region 116. While FIG. 3 illustrates the configuration in which the p-type semiconductor region 130 and the p-type semiconductor region 136 are separated from each other, the p-type semiconductor region 130 and the p-type semiconductor region 136 may contact each other.

The n-type semiconductor region 122a and the n-type semiconductor region 122b are disposed at a first depth from a first surface of the semiconductor substrate 110. The n-type semiconductor region 118 is disposed at a second depth that is shallower than the first depth from the first surface of the semiconductor substrate 110. In other words, the n-type semiconductor region 118 is disposed between the n-type semiconductor region 122a and the first surface of the semiconductor substrate 110. At the second depth, the FD region 120 is disposed. The p-type semiconductor region 134 is disposed at a third depth that is deeper than the first depth. In the orthogonal projection on the front surface of the semiconductor substrate 110, the n-type semiconductor region 118 and the FD region 120 are disposed at positions that do not overlap the p-type semiconductor regions 130 and 136.

The n-type semiconductor regions 122a and 122b each include a portion that overlaps the n-type semiconductor region 118 in a planar view. In this case, the impurity concentration of each of the n-type semiconductor regions 122a and 122b is lower than the impurity concentration of the n-type semiconductor region 118. The impurity concentration of the n-type semiconductor region 127 that is disposed between the n-type semiconductor region 122a and the n-type semiconductor region 118 and between the n-type semiconductor region 122b and the n-type semiconductor region 118 is lower than the impurity concentration of each of the n-type semiconductor region 122a and the n-type semiconductor region 122b. With this configuration, signal charges generated in the n-type semiconductor region 122a and the n-type semiconductor region 122b can be easily transferred to the n-type semiconductor region 118.

In the present exemplary embodiment, a part of the n-type semiconductor region 122a and a part of the n-type semiconductor region 122b are continuously formed from the first depth to the second depth. Specifically, the n-type semiconductor region 122a and the n-type semiconductor region 122b each include a region that extends in a direction parallel to the first surface of the semiconductor substrate 110 and is disposed at the first depth, and a region that extends in a direction vertical to the first surface and is continuously formed from the first depth to the second depth.

In the present exemplary embodiment, the transfer gate 125 of the transfer transistor Tx-A and the transfer gate 126 of the transfer transistor Tx-B are provided through the gate insulating film 123 on the semiconductor substrate 110 between the photoelectric conversion element 121 and the photoelectric conversion elements 132a and 132b. As described above, the transfer gate 125 controls transfer of signal charges accumulated in the photoelectric conversion element 132a, and the transfer gate 126 controls transfer of signal charges accumulated in the photoelectric conversion element 132b.

According to the present exemplary embodiment, the n-type semiconductor regions 122a and 122b are disposed in the region that is deeper than the photoelectric conversion element 121, and electrons generated by photoelectric conversion in the region deeper than the photoelectric conversion element 121 can be accumulated in the n-type semiconductor regions 122a and 122b. Accordingly, it is possible to prevent the electrons from moving to the n-type semiconductor region in other adjacent pixels 12 and being accumulated in the pixels 12. The impurity concentration of the n-type semiconductor region 118 is higher than the impurity concentration of each of the n-type semiconductor regions 122a and 122b, and the impurity concentration of each of the n-type semiconductor regions 122a and 122b is higher than the impurity concentration of the n-type semiconductor region 127. In this case, the n-type semiconductor regions 122a and 122b are surrounded by the p-type semiconductor regions 130, 136, and 134. Accordingly, when the n-type semiconductor regions 122a and 122b are saturated, the accumulated electric charges overflow to the n-type semiconductor region 118 through the n-type semiconductor region 127.

As described above, according to the present exemplary embodiment, it is possible to prevent the electrons generated by photoelectric conversion in the region deeper than the adjacent photoelectric conversion element 121 in the pixel 12 from moving between the two photoelectric conversion elements 122a and 122b. With this configuration, the photoelectric conversion apparatus in which the accuracy of information for automatic focus is enhanced by a focus detection method using an imaging plane phase difference method can be achieved. Further, signal charges more than the saturation charge amount of the photoelectric conversion elements 122a and 122b can be allowed to overflow to the photoelectric conversion element 121, thereby making it possible to increase the amount of signal charges to be read out.

An example of the operating of reading out electric charges according to the present exemplary embodiment will be described. FIG. 6 is a clock timing diagram illustrating an example of the operation of reading out electric charges. This timing diagram illustrates drive voltages Vsel, Vres, Vtx, Vtxa, and Vtxb of the selection transistor SEL, the reset transistor RES, and the transfer transistors Tx, Tx-A, and Tx-B, respectively, which are illustrated in FIG. 2. As illustrated in FIG. 6, when a low-level voltage is applied, each transistor is turned off, and when a high-level voltage is applied, each transistor is turned on. Specifically, when the low-level voltage is applied to the gate of each transistor, the transistor is electrically non-conductive, and when the high-level voltage is applied to the gate of each transistor, the transistor is electrically conductive. FIGS. 7A to 7F are potential diagrams in the semiconductor substrate 110 during the signal charge accumulation operation and the signal charge transfer operation of the photoelectric conversion apparatus in a configuration taken along a line C-C' illustrated in FIG. 4. FIGS. 8A to 8F are potential diagrams in the semiconductor substrate 110 during the signal charge accumulation operation and the signal charge transfer operation of the photoelectric conversion apparatus in a configuration taken along a line D-D' illustrated in FIG. 5. The potential diagrams each illustrate a potential for electrons that are signal charges. FIGS. 7A and 8A are potential diagrams corresponding to time (a) illustrated in FIG. 6, and FIGS. 7B and 8B are potential diagrams corresponding to time (b) illustrated in FIG. 6. Similarly, FIGS. 7C and 8C are potential diagrams corresponding to time (c) illustrated in FIG. 6, and FIGS. 7D and 8D are potential diagrams corresponding to time (d) illustrated in FIG. 6.

At time (a), signal charges are accumulated. As illustrated in FIGS. 7A and 8A, electric charges are accumulated in each of the photoelectric conversion elements 121, 132a, and 132b. At time (a), a low voltage is applied to the gate of each transistor. In this case, the height of a potential barrier between the photoelectric conversion element 132a and the photoelectric conversion element 121 as illustrated in FIG. 8A is lower than the height of a potential barrier between the photoelectric conversion element 132a and the photoelectric conversion element 132b as illustrated in FIG. 7A. Thus, electric charges that have overflowed from the photoelectric conversion element 132a and the photoelectric conversion element 132b can be allowed to flow to the photoelectric conversion element 121. Further, as illustrated in FIG. 8A, the height of a potential barrier between the photoelectric conversion element 121 and the FD region 120 is lower than the height of a potential barrier between the photoelectric conversion element 132a and the photoelectric conversion element 121. This prevents the electric charges that have overflowed from the photoelectric conversion element 121 from moving to other pixels 12.

At time (b), signal charges accumulated in the photoelectric conversion element 121 are read out. During the operation of reading out electric charges in the photoelectric conversion element 121 illustrated in FIGS. 7B and 8B, a high voltage is applied to the gate 124 of the transfer transistor Tx, and electric charges accumulated in the photoelectric conversion element 121 are transferred to the FD region 120.

At time (c), electric charges are read out from the photoelectric conversion element 132a. In the operation of reading out electric charges in the photoelectric conversion element 132a illustrated in FIGS. 7C and 8C, a high voltage is applied to the transfer gate 125 of the transfer transistor Tx-A, and electric charges accumulated in the photoelectric conversion element 132a are transferred to the photoelectric conversion element 121. In this case, a low voltage is applied to the transfer gate 124 of the transfer transistor Tx.

Thus, the signal charges transferred to the FD region 120 at time (b) can be read out from the pixel 12. A high voltage may be continuously applied to the transfer gate 125 of the transfer transistor Tx-A.

At time (d), the electric charges that have been transferred from the photoelectric conversion element 132a to the photoelectric conversion element 121 are transferred from the photoelectric conversion element 121 to the FD region 120. During the operation of reading out electric charges in the photoelectric conversion element 121 illustrated in FIGS. 7D and 8D, a high voltage is applied to the gate 124 of the transfer transistor Tx, and the electric charges that have been transferred to the photoelectric conversion element 121 are transferred to the FD region 120. In one embodiment, the period in which a high voltage is applied to the gate 125 of the transfer transistor Tx-A and the period in which a high voltage is applied to the gate 124 of the transfer transistor Tx at least partially overlap each other. With this configuration, the period from a time when the transfer transistor Tx-A is turned to a time when signal charges are transferred to the FD region 120 can be reduced as compared with a case where the periods do not overlap each other.

After that, similarly to the operations at times (c) and (d), electric charges accumulated in the photoelectric conversion element 132b are transferred to the photoelectric conversion element 121, and signal charges are transferred from the photoelectric conversion element 121 to the FD region 120. Specifically, at time (e), electric charges are read out from the photoelectric conversion element 132b. During the operation of reading out electric charges in the photoelectric conversion element 132b illustrated in FIGS. 7E and 8E, a high voltage is applied to the transfer gate 126 of the transfer transistor Tx-B, and electric charges accumulated in the photoelectric conversion element 132b are transferred to the photoelectric conversion element 121. In this case, a low voltage is applied to the transfer gate 124 of the transfer transistor Tx. With this configuration, the signal charges transferred to the FD region 120 at time (e) can be read out from the pixel 12. A high voltage may be continuously applied to the transfer gate 126 of the transfer transistor Tx-B.

At time (f), the electric charges that have been transferred from the photoelectric conversion element 132b to the photoelectric conversion element 121 are transferred from the photoelectric conversion element 121 to the FD region 120. During the operation of reading out electric charges in the photoelectric conversion element 121 illustrated in FIGS. 7F and 8F, a high voltage is applied to the transfer gate 124 of the transfer transistor Tx, and the electric charges transferred to the photoelectric conversion element 121 are transferred to the FD region 120. In one embodiment, the period in which a high voltage is applied to the transfer gate 126 of the transfer transistor Tx-B and the period in which a high voltage is applied to the transfer gate 124 of the transfer transistor Tx at least partially overlap each other. With this configuration, the period from a time when the transfer transistor Tx-B is turned to a time when signal charges are transferred to the FD region 120 can be reduced as compared with a case where the periods do not overlap each other.

The above-described driving operation makes it possible to acquire a focus detection signal without impairing the quality of an image capturing signal, while increasing the saturation charge amount.

Under a high illuminance, in one embodiment, an electric charge readout operation is performed different from the electric charge readout operations illustrated in FIGS. 6 to 8F. An example of the electric charge readout operation under a high illuminance will be described with reference to FIGS. 9 to 11H.

FIG. 9 is a clock timing diagram illustrating an example of the electric charge readout operation, and the components similar to those illustrated in FIG. 6 are denoted by the same reference symbols and the descriptions thereof are omitted. FIGS. 10A to 10H are potential diagrams in the semiconductor substrate 110 during the signal charge accumulation operation and the signal charge transfer operation of the photoelectric conversion apparatus in the configuration taken along the line C-C' illustrated in FIG. 4. FIGS. 11A to 11H are potential diagrams in the semiconductor substrate 110 during the signal charge accumulation operation and the signal charge transfer operation of the photoelectric conversion apparatus in the configuration taken along the line D-D' illustrated in FIG. 5. The potential diagrams each illustrate a potential for electrons that are signal charges. FIGS. 10A and 11A are potential diagrams corresponding to time (a) illustrated in FIG. 9. FIGS. 10B and 11B are potential diagrams corresponding to time (b) illustrated in FIG. 9. FIGS. 10C and 11C are potential diagrams corresponding to time (c) illustrated in FIG. 9. Similarly, FIGS. 10D and 11D are potential diagrams corresponding to time (d) illustrated in FIG. 9. FIGS. 10E and 11E are potential diagrams corresponding to time (e) illustrated in FIG. 9. FIGS. 10F and 11F are potential diagrams corresponding to time (f) illustrated in FIG. 9. Similarly, FIGS. 10G and 11G are potential diagrams corresponding to time (g) illustrated in FIG. 9. FIGS. 10H and 11H are potential diagrams corresponding to time (h) illustrated in FIG. 9.

At times (a) and (b), signal charges are accumulated in each of the photoelectric conversion elements 121, 132a, and 132b. The operation at time (a) is similar to the operation at time (a) illustrated in FIG. 6. However, at time (b), signal charges from the photoelectric conversion elements 132a and 132b are saturated. At time (b), electric charges generated by photoelectric conversion in the photoelectric conversion elements 132a and 132b overflow to the photoelectric conversion element 121. This is because, as described above, the potential at which signals are more likely to flow to the photoelectric conversion element 121 than to the space between the photoelectric conversion elements 132a and 132b is set.

Under a high illuminance, at time (c), a high voltage is applied to each of the transfer gate 125 of the transfer transistor Tx-A and the transfer gate 126 of the transfer transistor Tx-B, and electric charges accumulated in the photoelectric conversion element 132a and the photoelectric conversion element 132b are transferred to the photoelectric conversion element 121. With this configuration, signal charges accumulated in the photoelectric conversion elements 132a and 132b for focus detection can be reset.

At time (d), a low voltage is applied to the transfer gate 125 of the transfer transistor Tx-A and the transfer gate 126 of the transfer transistor Tx-B. This brings the resetting of electric charges in the photoelectric conversion elements 132a and 132b for focus detection to an end. As a result, the potential in each of the photoelectric conversion elements 132a and 132b is brought into a reset state.

At time (e), signal charges are accumulated in each of the photoelectric conversion elements 121, 132a, and 132b. In this case, a low voltage is applied to the gate of each transistor.

At time (f), a high voltage is applied to the transfer gate 124 of the transfer transistor Tx.

During the operation of reading out electric charges in the photoelectric conversion element 121 illustrated in FIGS. 10F and 11F, a high voltage is applied to the transfer gate 124 of the transfer transistor Tx, and electric charges accumulated in the photoelectric conversion element 121 are transferred to the FD region 120.

Operations at time (g) and subsequent times are similar to those at time (c) and subsequent times illustrated in FIG. 6, and thus the descriptions thereof are omitted.

The above-described driving operation makes it possible to set the accumulation time for the photoelectric conversion elements 132a and 132b for focus detection to be shorter than the accumulation time for the photoelectric conversion element 131 for image capturing, and also makes it possible to control the signal amount for focus detection pixels. Accordingly, the focus detection can be achieved even under a high illuminance at which the photoelectric conversion element 121 for image capturing is saturated. The photoelectric conversion apparatus in which the accuracy of information for automatic focus under a high illuminance is enhanced can be achieved by the focus detection method using the imaging plane phase difference method under such a high illuminance.

In the configuration illustrated in FIG. 4, the height of a potential barrier between the n-type semiconductor region 122a and the n-type semiconductor region 122b is set to be higher than the height of a potential barrier between the n-type semiconductor region 118 and the n-type semiconductor region 122a. However, this configuration is not essential. The height of a potential barrier can be arbitrarily set as long as the height of a potential barrier between adjacent pixels 12 and between the n-type semiconductor region 118 and the FD region 120 is higher than the height of a potential barrier between the n-type semiconductor region 118 and each of the n-type semiconductor regions 122a and 122b in the pixel 12. For example, the height of the potential barrier between the n-type semiconductor region 122a and the n-type semiconductor region 122b may be lower than the height of a potential barrier between the n-type semiconductor region 122a and the n-type semiconductor region 118. Further, as illustrated in FIG. 12, the height of the potential barrier between the n-type semiconductor region 122a and the n-type semiconductor region 122b may be equal to the height of the potential barrier between the n-type semiconductor region 122a and the n-type semiconductor region 118. Also, in this case, it is possible to increase the saturation charge amount while reducing crosstalk between the pixels 12.

Figure 13:
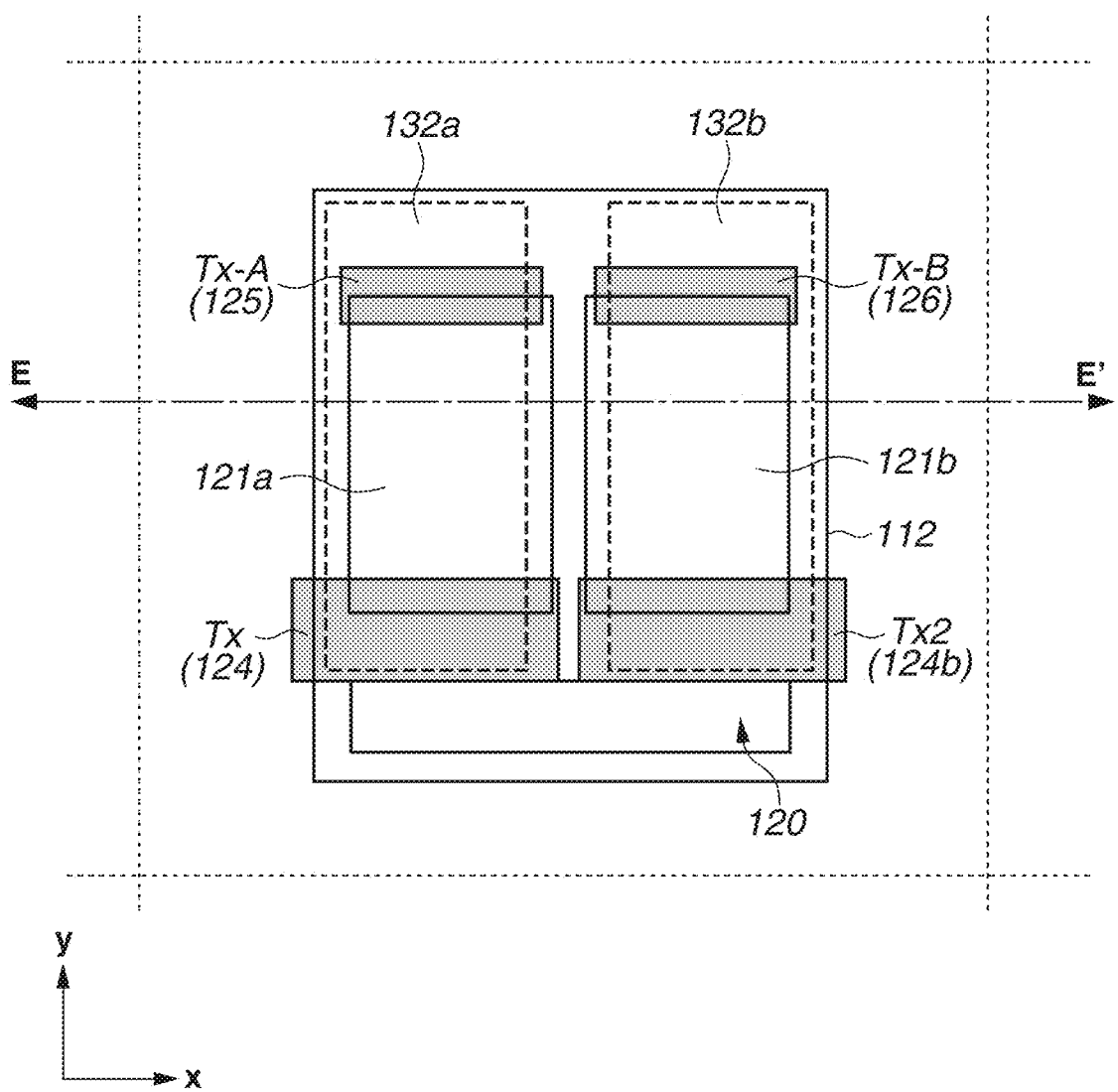
FIG. 13 is a plan view illustrating a unit cell of a photoelectric conversion apparatus according to a second exemplary embodiment.
Figure 14:
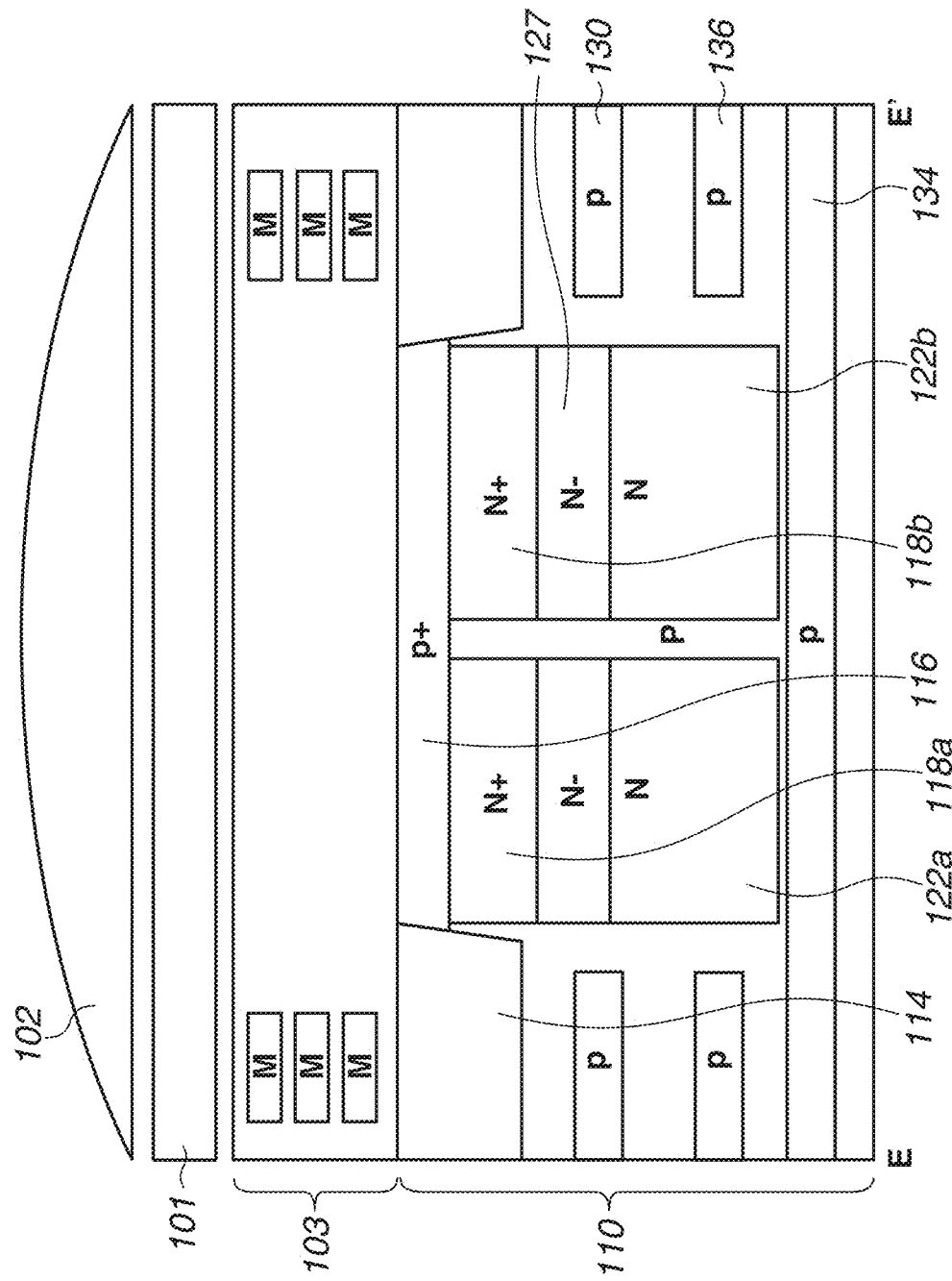
FIG. 14 is a sectional view illustrating the photoelectric conversion apparatus according to the second exemplary embodiment.
Figure 15:
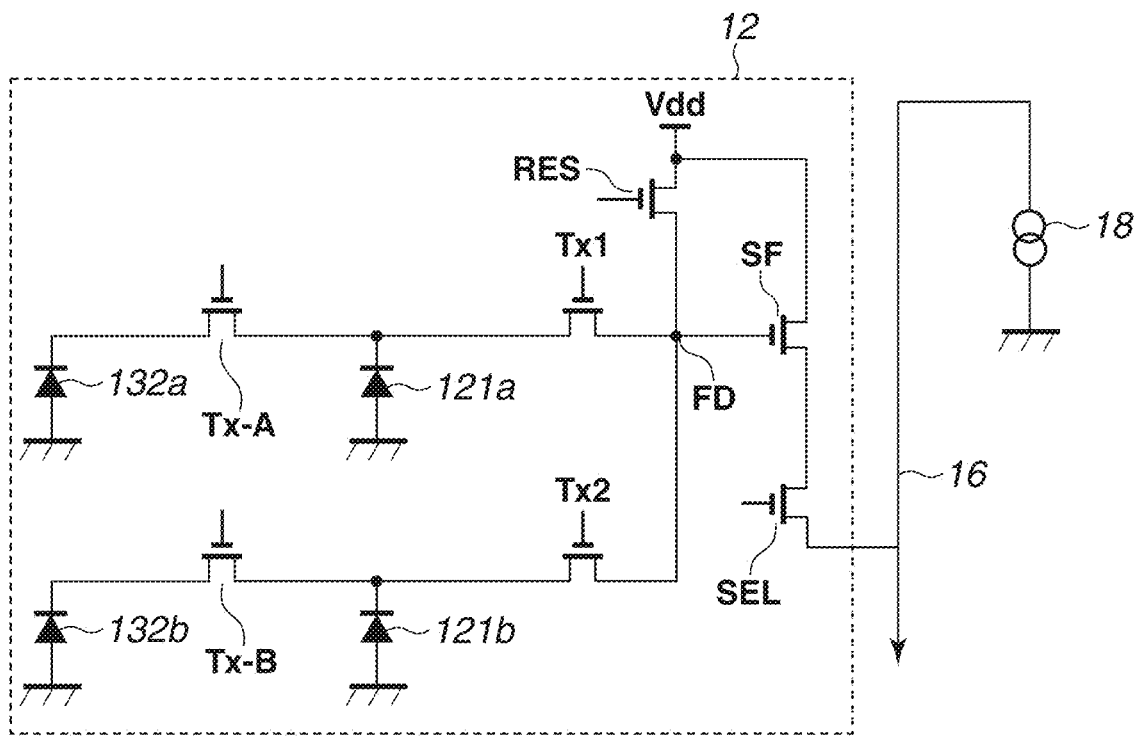
FIG. 15 is an equivalent circuit diagram illustrating the unit cell of the photoelectric conversion apparatus according to the second exemplary embodiment.

A photoelectric conversion apparatus according to a second exemplary embodiment will be described with reference to FIGS. 13 to 15. FIG. 13 is a plan view illustrating a layout of the pixel 12 of the photoelectric conversion apparatus according to the present exemplary embodiment. FIG. 14 is a schematic sectional view taken along a line E-E illustrated in FIG. 13. FIG. 15 is an equivalent circuit diagram illustrating the pixel 12 according to the present exemplary embodiment. In the photoelectric conversion apparatus according to the present exemplary embodiment, two photoelectric conversion elements for image capturing are separately provided and transfer gates respectively corresponding to the photoelectric conversion elements are provided. Except for this point and the following points, the second exemplary embodiment is substantially the same as the first exemplary embodiment, and thus the descriptions thereof are omitted.

In the photoelectric conversion apparatus according to the first exemplary embodiment, the photoelectric conversion element 121 includes the n-type semiconductor region 118 and the p-type semiconductor region 116 in a planar view. The photoelectric conversion apparatus according to the present exemplary embodiment includes photoelectric conversion elements 121a and 121b. The photoelectric conversion elements 121a and 121b are separated from each other. Specifically, in the photoelectric conversion apparatus according to the present exemplary embodiment, the photoelectric conversion elements 121a and 121b are used as photoelectric conversion elements for image capturing. The photoelectric conversion element 121a includes an n-type semiconductor region 118a and the p-type semiconductor region 116. The photoelectric conversion element 121b includes an n-type semiconductor region 118b and the p-type semiconductor region 116. Specifically, the n-type semiconductor region 118a and the p-type semiconductor region 116 form the photoelectric conversion element 121a as a buried photodiode, and the n-type semiconductor region 118b and the p-type semiconductor region 116 form the photoelectric conversion element 121b as a buried photodiode. A transfer gate 124a of a transfer transistor Tx-1 is disposed between the photoelectric conversion element 121a and the FD region 120 in a planar view. A transfer gate 124b of a transfer transistor Tx-2 is disposed between the photoelectric conversion element 121b and the FD region 120. The photoelectric conversion element 132a includes a portion that overlaps the photoelectric conversion element 121a in a planar view. The photoelectric conversion element 132b includes a portion that overlaps the photoelectric conversion element 121b in a planar view.

The transfer gates 124a and 124b, which are the gates of the transfer transistors Tx-1 and Tx-2, respectively, transfer electric charges generated in the photoelectric conversion elements 121a and 121b, respectively, to the FD region 120. The transfer gates 125 and 126 transfer electric charges generated in the photoelectric conversion elements 132a and 132b to the photoelectric conversion elements 121a and 121b, respectively.

As illustrated in FIG. 15, each pixel 12 includes the photoelectric conversion elements 121a and 121b, the transfer transistors Tx1 and Tx2, the photoelectric conversion elements 132a and 132b, and the transfer transistors Tx-A and Tx-B. The FD and the other components are similar to those illustrated in FIG. 2, and thus the descriptions thereof are omitted. The photoelectric conversion elements 121a, 121b, 132a, and 132b are, for example, photodiodes. Anodes of the photoelectric conversion elements 121a, 121b, 132a, and 132b are each connected to the ground voltage line, and cathodes of the photoelectric conversion elements 121a, 121b, 132a, and 132b are connected to the sources of the transfer transistors Tx1, Tx2, Tx-A, and Tx-B, respectively. The drain of each of the transfer transistors Tx1 and Tx2 is connected to the source of the reset transistor RES and the gate of the amplification transistor SF.

According to the present exemplary embodiment, like in the first exemplary embodiment, it is possible to prevent the electrons generated by photoelectric conversion in the region that is deeper than the adjacent photoelectric conversion elements 121a and 121b in the pixel 12 from moving between the two photoelectric conversion elements 122a and 122b. With this configuration, the photoelectric conversion apparatus in which the accuracy of information for automatic focus is enhanced by the focus detection method using the imaging plane phase difference method can be achieved. Further, signal charges more than the saturation charge amount of the photoelectric conversion elements 122a and 122b can be allowed to overflow to the photoelectric conversion element 121, thereby making it possible to increase the amount of signal charges to be read out.

Figure 16:
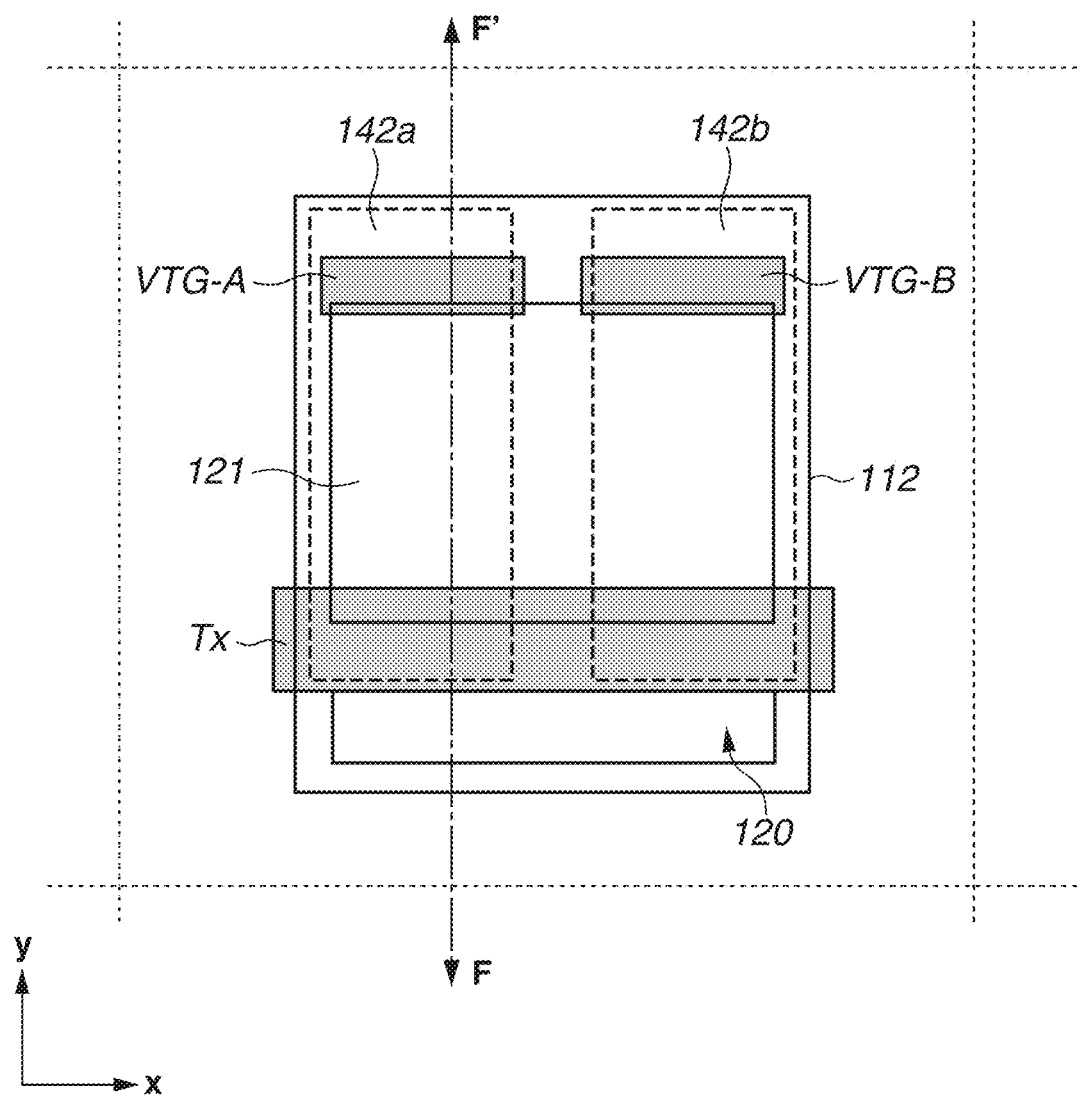
FIG. 16 is a plan view illustrating a unit cell of a photoelectric conversion apparatus according to a third exemplary embodiment.
Figure 17:
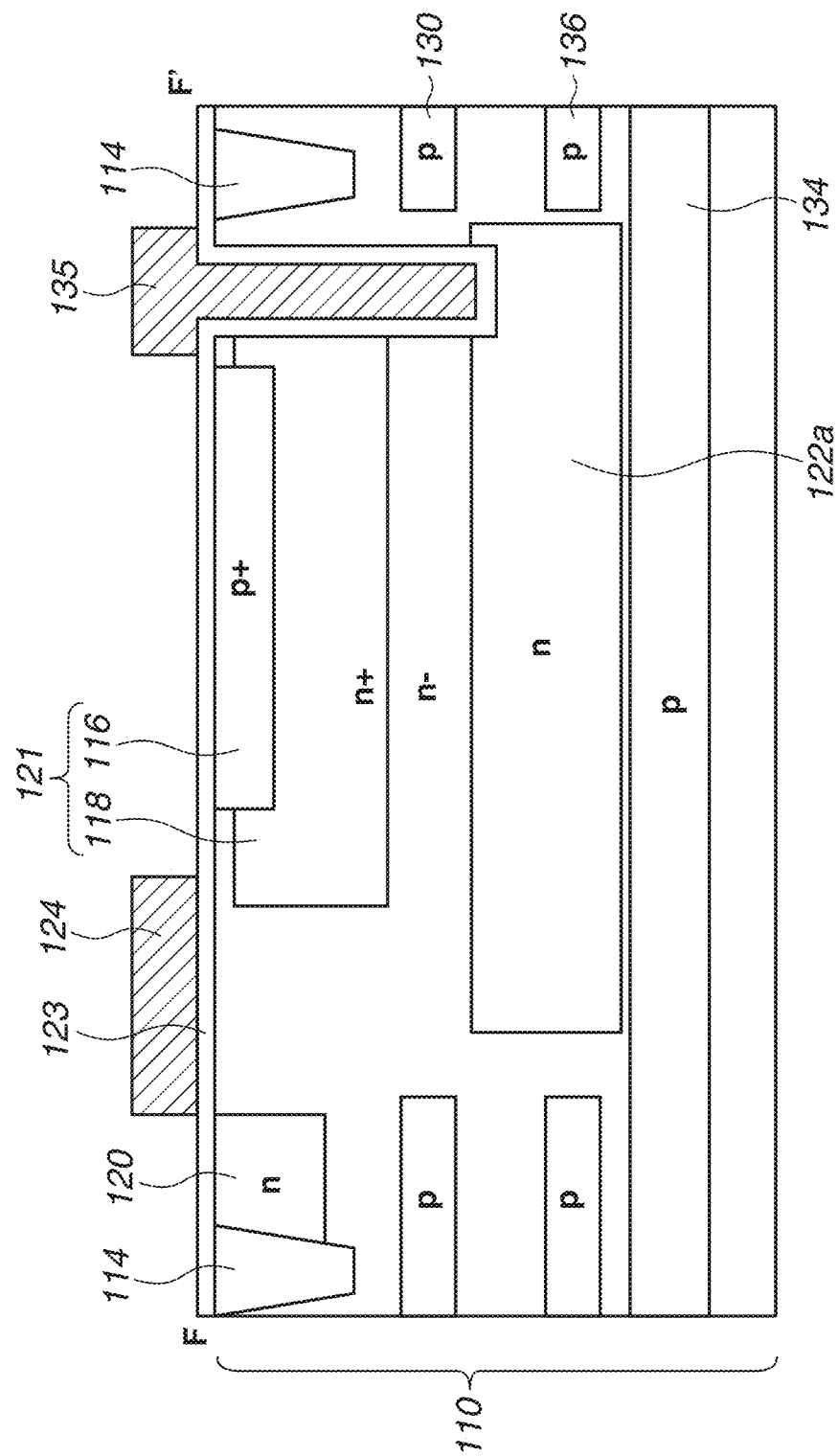
FIG. 17 is a sectional view illustrating the photoelectric conversion apparatus according to the third exemplary embodiment.

A photoelectric conversion apparatus according to a third exemplary embodiment will be described with reference to FIGS. 16 and 17. FIG. 16 is a plan view illustrating a layout of the pixel 12 of the photoelectric conversion apparatus according to the present exemplary embodiment. FIG. 17 is a schematic sectional view taken along a line F-F illustrated in FIG. 16. In the present exemplary embodiment, a vertical transfer gate (VTG) is used as the transfer gate for controlling transfer of electric charges from the photoelectric conversion elements 122a and 122b to the photoelectric conversion element 121. Except for this point and the following points, the third exemplary embodiment is substantially the same as the first exemplary embodiment, and thus the descriptions thereof are omitted.

The photoelectric conversion apparatus according to the present exemplary embodiment differs from the photoelectric conversion apparatus according to the first exemplary embodiment in regard to the structure of each of the photoelectric conversion elements 132a and 132b and the transfer transistors Tx-A and Tx-B in a planar view as illustrated in FIGS. 16 and 17. In the photoelectric conversion apparatus according to the present exemplary embodiment, photoelectric conversion elements 142a and 142b are formed of the n-type semiconductor regions 122a and 122b, respectively. Further, vertical transfer transistors VTG-A and VTG-B include vertical transfer gate electrodes 135 and 136, respectively, which are provided through the gate insulating film 123 on the semiconductor substrate 110 between the photoelectric conversion element 121 and the photoelectric conversion elements 142a and 142b for focus detection. The vertical transistors VTG-A and VTG-B are formed to extend to positions where the vertical transfer gate electrodes 135 and 136 reach the photoelectric conversion elements 142a and 142b, respectively, in the depth direction. In other words, the vertical transfer gate electrodes 135 and 136 are buried in the semiconductor substrate 110 in the depth direction of the semiconductor substrate 110. The depth at which the vertical transfer gate electrodes 135 and 136 are buried corresponds to the position to be contact with the n-type semiconductor regions 122a and 122b of the photoelectric conversion elements 142a and 142b, respectively. The vertical transfer gate electrodes 135 and 136 transfer to the photoelectric conversion element 121 electric charges generated in the photoelectric conversion elements 142a and 142b, respectively, by applying a desired voltage.

In the present exemplary embodiment, the use of the vertical transfer gate makes it possible to control transfer of electric charges, thereby eliminating the need for forming the n-type semiconductor regions 122a and 122b to the second depth.

In the present exemplary embodiment, like in the first exemplary embodiment, it is possible to prevent the electrons generated by photoelectric conversion in the region that is deeper than the adjacent photoelectric conversion elements 121a and 121b in the pixel 12 from moving between the two photoelectric conversion elements 122a and 122b. With this configuration, the photoelectric conversion apparatus in which the accuracy of information for automatic focus is enhanced by the focus detection method using the imaging plane phase difference method can be achieved. Further, signal charges more than the saturation charge amount of the photoelectric conversion elements 122a and 122b can be allowed to overflow to the photoelectric conversion element 121, thereby making it possible to increase the amount of signal charges to be read out.

Furthermore, the use of the vertical transfer transistor makes it possible to increase the area of the photoelectric conversion element 121 for image capturing. Consequently, it is possible to acquire a highly accurate focus detection signal and increase the saturation charge amount for image capturing.

Figure 18:
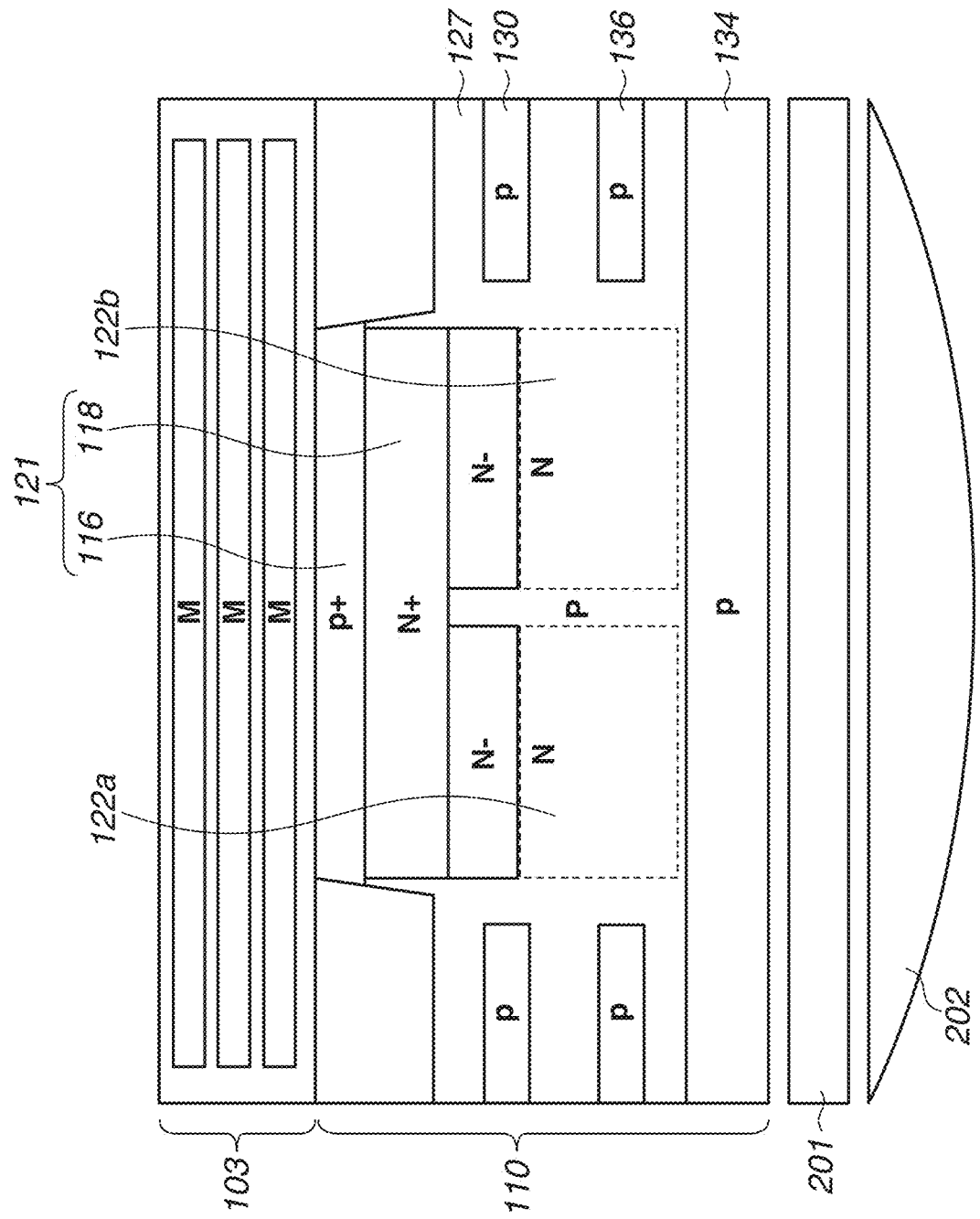
FIG. 18 is a sectional view illustrating a photoelectric conversion apparatus according to a fourth exemplary embodiment.

A photoelectric conversion apparatus according to a fourth exemplary embodiment will be described with reference to FIG. 18. FIG. 18 is a schematic sectional view illustrating the photoelectric conversion apparatus according to the present exemplary embodiment. The present exemplary embodiment illustrates a back surface irradiation type photoelectric conversion apparatus on which light is incident from the back surface. Except for this point and the following points, the fourth exemplary embodiment is substantially the same as the first exemplary embodiment, and thus the descriptions thereof are omitted. The first to third exemplary embodiments may employ the configuration according to the fourth exemplary embodiment.

In the present exemplary embodiment, a color filter 201 and a microlens 202 are provided on the back surface of the semiconductor substrate 110. Transistors and wiring layers are provided on the first surface. The configurations of the color filter 201 and the microlens 202 are similar to the above-described configurations of the color filter 101 and microlens 102, respectively, and thus the descriptions thereof are omitted.

Since the present exemplary embodiment illustrates the back surface irradiation type photoelectric conversion apparatus, the incident light is first transmitted through the photoelectric conversion element 132a or 132b for focus detection and then reaches the photoelectric conversion element 121 for image capturing. This configuration increases the probability that electric charges to be generated by photoelectric conversion can be generated in the photoelectric conversion elements 132a and 132b. The photoelectric conversion apparatus in which the accuracy of information for automatic focus is further enhanced can be achieved by arranging the photoelectric conversion elements 132a and 132b for focus detection on the incidence side.

Figure 19:
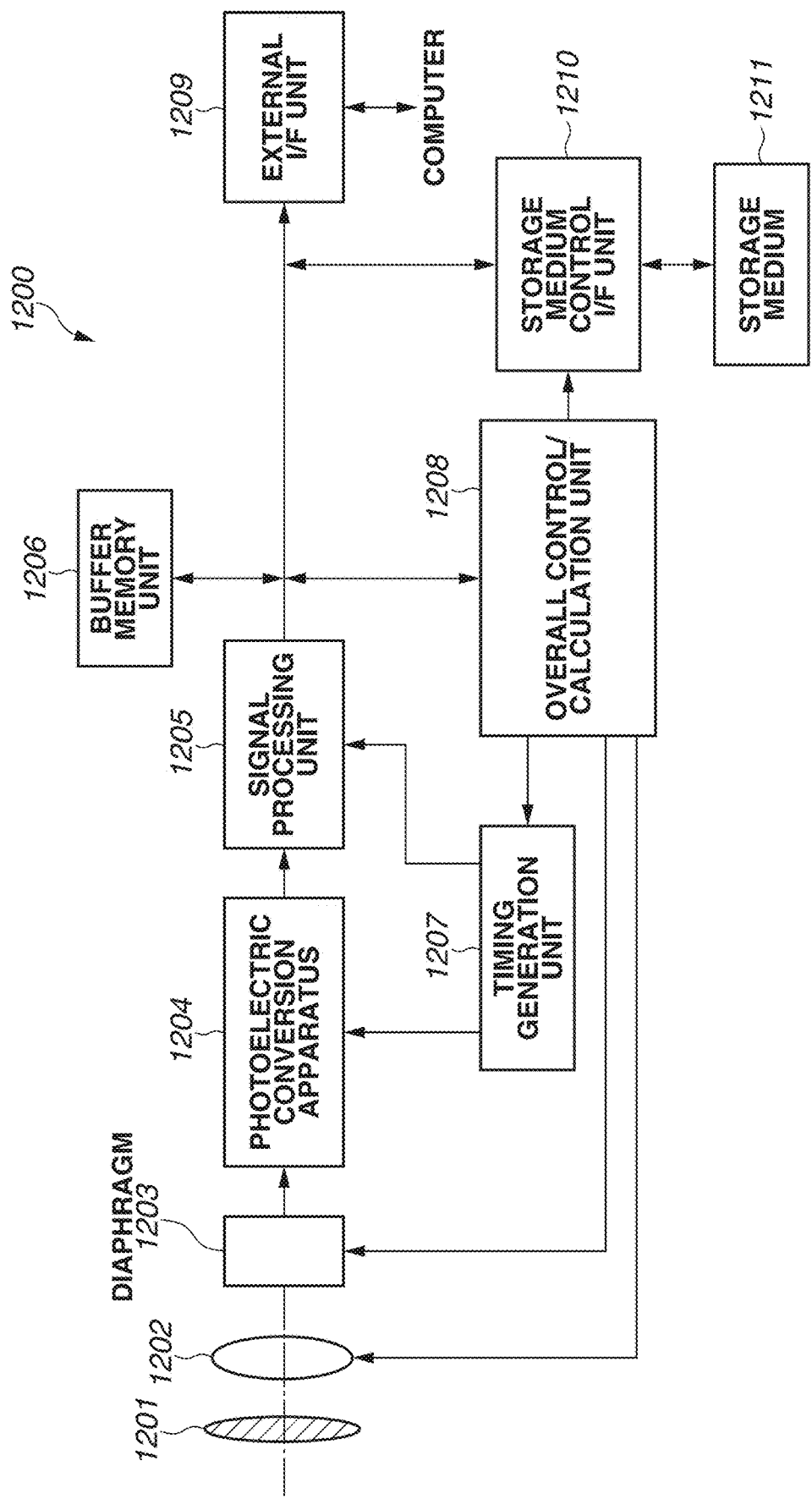
FIG. 19 is a block diagram illustrating a photoelectric conversion system according to a fifth exemplary embodiment.

FIG. 19 is a block diagram illustrating a configuration example of a photoelectric conversion system 1200 according to a fifth exemplary embodiment. The photoelectric conversion system 1200 according to the present exemplary embodiment includes a photoelectric conversion apparatus 1204. In this case, any one of the photoelectric conversion apparatuses described in the above-described exemplary embodiments can be used as the photoelectric conversion apparatus 1204. The photoelectric conversion system 1200 can be used as, for example, an image capturing system. Specific examples of the image capturing system include a digital still camera, a digital camcorder, and a monitoring camera. FIG. 19 illustrates an example where a digital still camera is used as the photoelectric conversion system 1200.

The photoelectric conversion system 1200 illustrated in FIG. 19 includes the photoelectric conversion apparatus 1204, a lens 1202 that forms an optical image of an object on the photoelectric conversion apparatus 1204, a diaphragm 1203 for varying the amount of light to be transmitted through the lens 1202, and a barrier 1201 for protecting the lens 1202. The lens 1202 and the diaphragm 1203 are optical systems for collecting light on the photoelectric conversion apparatus 1204.

The photoelectric conversion system 1200 further includes a signal processing unit 1205 that processes an output signal output from the photoelectric conversion apparatus 1204. The signal processing unit 1205 performs various kinds of correction and compression processing on the input signal, as needed, and performs processing operations on the signal to be output. The photoelectric conversion system 1200 further includes a buffer memory unit 1206 for temporarily storing image data, and an external interface unit (I/F) unit 1209 for communicating with an external computer and the like. The photoelectric conversion system 1200 further includes a storage medium 1211, such as a semiconductor memory, for recording or reading out image capturing data, and a storage medium control I/F unit 1210 for recording data on or reading out data from the storage medium 1211. The storage medium 1211 may be incorporated in the photoelectric conversion system 1200, or may be detachably mounted on the photosensitive conversion system 1200. Further, communication from the storage medium control I/F unit 1210 to the storage medium 1211 or communication from the external I/F unit 1209 can be established via a wireless connection.

The photoelectric conversion system 1200 further includes an overall control/calculation unit 1208 that performs various calculations and controls the overall operation of the digital still camera, and a timing generation unit 1207 that outputs various timing signals to the photoelectric conversion apparatus 1204 and the signal processing unit 1205. In this case, the timing signals and the like may be externally input, and the photoelectric conversion system 1200 may include at least the photoelectric conversion apparatus 1204 and the signal processing unit 1205 that processes the output signal output from the photoelectric conversion apparatus 1204. As described in the fourth exemplary embodiment, the timing generation unit 1207 may be mounted on the photoelectric conversion apparatus. The overall control/calculation unit 1208 and the timing generation unit 1207 may be configured to implement some or all of the control functions of the photoelectric conversion apparatus 1204.

The photoelectric conversion apparatus 1204 outputs an image signal to the signal processing unit 1205. The signal processing unit 1205 performs predetermined signal processing on the image signal output from the photoelectric conversion apparatus 1204, and outputs image data. Further, the signal processing unit 1205 generates an image using the image signal. Furthermore, the signal processing unit 1205 may perform a ranging calculation on the signal output from the photoelectric conversion apparatus 1204. The signal processing unit 1205 and the timing generation unit 1207 may be mounted on the photoelectric conversion apparatus. In other words, the signal processing unit 1205 and the timing generation unit 1207 may be provided on a substrate on which the pixels 12 are arranged, or may be provided on another substrate. The image capturing system capable of acquiring an image with a higher quality can be achieved by configuring the image capturing system using any one of the photoelectric conversion apparatuses according to the exemplary embodiments described above.

Figure 20A:
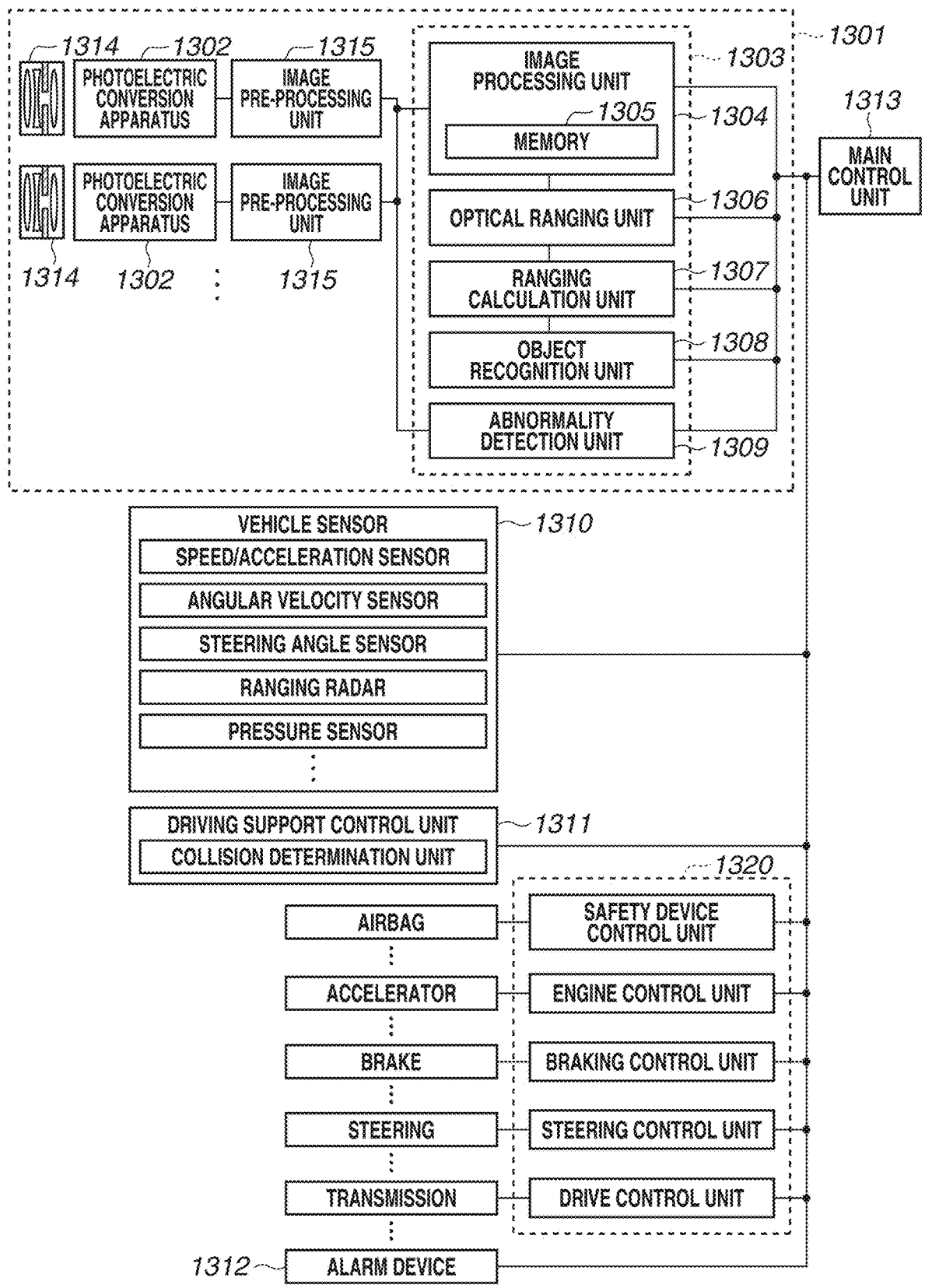
FIG. 20A is a block diagram illustrating a photoelectric conversion system according to a sixth exemplary embodiment.

A photoelectric conversion system and a moving body according to a sixth exemplary embodiment will be described with reference to FIGS. 20A and 20B and FIG. 21. FIG. 20A is a block diagram schematically illustrating a configuration example of the photoelectric conversion system according to the present exemplary embodiment, and FIG. 20B is a schematic view illustrating a configuration example of the moving body according to the present exemplary embodiment. FIG. 21 is a flowchart illustrating an operation to be performed by the photoelectric conversion system according to the present exemplary embodiment. The present exemplary embodiment illustrates an example where an on-vehicle camera is used as the photoelectric conversion system.

FIGS. 20A and 20B each illustrate a configuration example of a vehicle system and a photoelectric conversion system for image capturing to be mounted on the vehicle system. A photoelectric conversion system 1301 includes photoelectric conversion apparatuses 1302, image pre-processing units 1315, an integrated circuit 1303, and optical systems 1314. Each optical system 1314 forms an optical image of an object on the corresponding photoelectric conversion apparatus 1302. Each photoelectric conversion apparatus 1302 converts the optical image of the object formed by the corresponding optical system 1314 into an electric signal. Each photoelectric conversion apparatus 1302 is any one of the photoelectric conversion apparatuses according to the exemplary embodiments described above. Each image pre-processing unit 1315 performs predetermined signal processing on the signal output from the corresponding photoelectric conversion apparatus 1302. The function of each image pre-processing unit 1315 may be incorporated in the corresponding photoelectric conversion apparatus 1302. The photoelectric conversion system 1301 is provided with at least two sets of the optical system 1314, the photoelectric conversion apparatus 1302, and the image pre-processing unit 1315, and an output signal from the image pre-processing unit 1315 in each set is input to the integrated circuit 1303.

The integrated circuit 1303 is an integrated circuit for the image capturing system, and includes an image processing unit 1304 including a memory 1305, an optical ranging unit 1306, a ranging calculation unit 1307, an object recognition unit 1308, and an abnormality detection unit 1309. The image processing unit 1304 performs image processing, such as development processing and defect correction processing, on the output signal from the image pre-processing unit 1315. The memory 1305 primarily stores captured images and stores a defect position in each image capturing pixel. The optical ranging unit 1306 performs focusing of an object and ranging. The ranging calculation unit 1307 calculates ranging information based on a plurality of pieces of image data acquired by the plurality of photoelectric conversion apparatuses 1302. The object recognition unit 1308 recognizes objects such as a vehicle, a road, a sign, and a person. Upon detecting an abnormality in the photoelectric conversion apparatuses 1302, the abnormality detection unit 1309 issues an alarm to a main control unit 1313 to notify that an abnormality has occurred.

The integrated circuit 1303 may be implemented by hardware designed for exclusive use, may be implemented by a software module, or may be implemented by a combination thereof. Further, the integrated circuit 1303 may be implemented by a field programmable gate array (FPGA), an application specific integrated circuit (ASIC), or the like, or a combination thereof.

The main control unit 1313 controls the operations of the photoelectric conversion system 1301, a vehicle sensor 1310, a control unit 1320, and the like in an integrated manner. The main control unit 1313 may be omitted, and each of the photoelectric conversion system 1301, the vehicle sensor 1310, and the control unit 1320 may include a communication interface to transmit or receive a control signal via a communication network (e.g., controller area network (CAN) standards).

The integrated circuit 1303 includes a function for receiving a control signal from the main control unit 1313, or transmitting a control signal or a setting value to each photoelectric conversion apparatus 1302 by a control unit of the integrated circuit 1303.

The photoelectric conversion system 1301 is connected to the vehicle sensor 1310, and can detect a travelling state of the vehicle, such as a vehicle speed, a yaw rate, and a steering angle, a vehicle external environment, and states of other vehicles and obstacles. The vehicle sensor 1310 also functions as a distance information acquisition unit that acquires distance information about a distance to a target object. Further, the photoelectric conversion system 1301 is connected to a driving support control unit 1311 that performs various driving support operations such as automatic steering, automatic cruising, and collision prevention functions. In particular, as for a collision determination function, it is estimated whether a collision with other vehicles or obstacles occurs, or it is determined whether a collision with other vehicles or obstacles has occurred based on detection results from the photoelectric conversion system 1301 and the vehicle sensor 1310. Thus, an avoidance control is performed when it is estimated that a collision may occur, or a safety apparatus is activated when it is determined that a collision has occurred.

The photoelectric conversion system 1301 is also connected to an alarm device 1312, which issues an alarm to a driver, based on a determination result from a collision determination unit. For example, if it is highly likely that a collision may occur based on the result of determination by the collision determination unit, the main control unit 1313 performs vehicle control for avoiding a collision or reducing a damage by, for example, applying a brake, releasing an accelerator, or suppressing an engine output. The alarm device 1312 issues an alarm to a user by, for example, issuing an alarm such as sound, displaying alarm information on a screen of a display unit, such as a car navigation system or a meter panel, or applying a vibration to a seat belt or a steering wheel.

In the present exemplary embodiment, the photoelectric conversion system 1301 captures an image of the periphery of the vehicle, for example, the front or the back of the vehicle. FIG. 20B illustrates a layout example of the photoelectric conversion system 1301 when an image of a front portion of the vehicle is captured by the photoelectric conversion system 1301.

Two photoelectric conversion apparatuses 1302 are provided at the front side of a vehicle 1300. Specifically, assuming that a central line with respect to an advancing/receding direction of the vehicle 1300 or the contour of the vehicle 1300 (e.g., the width of the vehicle) is regarded as a symmetric axis, the two photoelectric conversion apparatuses 1302 may be provided to be symmetric to the symmetric axis so as to acquire distance information about a distance between the vehicle 1300 and a target object and determine the possibility of occurrence of a collision. Further, the photoelectric conversion apparatuses 1302 may be disposed at a position where the driver's field of view is not inhibited when an outside state of the vehicle 1300 is visually observed by the driver from a driver's seat. The alarm device 1312 may be disposed at a position where the alarm device 1312 can easily come into the driver's sight.

Next, a failure detection operation for each photoelectric conversion apparatus 1302 in the photoelectric conversion system 1301 will be described with reference to FIG. 21. The failure detection operation for each photoelectric conversion apparatus 1302 is carried out in accordance with steps S1410 to S1480 illustrated in FIG. 21.

In step S1410, a setting for start-up of the photoelectric conversion apparatus 1302 is made. Specifically, the setting for the operation of the photoelectric conversion apparatus 1302 is transmitted from the outside (e.g., the main control unit 1313) of the photoelectric conversion system 1301 or from the inside of the photoelectric conversion system 1301, and the image capturing operation and failure detection operation of the photoelectric conversion apparatus 1302 are started.

Next, in step S1420, a pixel signal is acquired from an effective pixel. In step S1430, an output value from a failure detection pixel provided for failure detection is acquired. This failure detection pixel includes a photoelectric conversion unit, like in the effective pixel. A predetermined voltage is written into the photoelectric conversion unit. The failure detection pixel outputs a signal corresponding to the voltage written in the photoelectric conversion unit. Steps S1420 and S1430 may be reversed.

Next, in step S1440, it is determined whether an expected output value from the failure detection pixel matches an actual output value from the failure detection pixel. As a result of determination in step S1440, if the expected output value matches the actual output value (YES in step S1440), the processing proceeds to step S1450. In step S1450, it is determined that the image capturing operation is normally performed, and then the processing proceeds to step S1460. In step S1460, a pixel signal in a scanning row is transmitted to the memory 1305 and is primarily stored in the memory 1305. After that, the processing returns to step S1420 to continue the failure detection operation. On the other hand, as a result of determination in step S1440, if the expected output value does not match the actual output value (NO in step S1440), the processing proceeds to step S1470. In step S1470, it is determined that an abnormality has occurred in the image capturing operation, and an alarm is issued to the main control unit 1313 or the alarm device 1312. The alarm device 1312 causes the display unit to display information indicating that an abnormality has been detected. After that, in step S1480, the photoelectric conversion apparatus 1302 is stopped to terminate the operation of the photoelectric conversion system 1301.

While the present exemplary embodiment illustrates an example where the flowchart is looped for each row, the flowchart may be looped for a plurality of rows, or the failure detection operation may be performed for each frame. In step S1470, an alarm may be issued by sending a notification to the outside of the vehicle via a wireless network.

While the present exemplary embodiment described above illustrates an example of a control operation for preventing the vehicle from colliding with another vehicle, the present exemplary embodiment can also be applied to, for example, a control operation for automatic driving by following another vehicle, and a control operation for automatic driving to prevent the vehicle from deviating from a lane. Further, the photoelectric conversion system 1301 is not limited to being applied to a vehicle, such as a vehicle in which the photoelectric conversion system 1301 is mounted, but instead can be applied to, for example, a moving body (moving apparatus), such as a ship, an aircraft, or an industrial robot. In addition, the disclosure is not limited to being applied to a moving body, but instead can be applied to devices that widely use object recognition, such as an intelligent transportation system (ITS).

A photoelectric conversion apparatus according to an aspect of the embodiments may be configured to acquire various kinds of information such as distance information.

A photoelectric conversion apparatus according to an aspect of the embodiments can increase the saturation charge amount while reducing crosstalk between pixels.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2020-180629, filed Oct. 28, 2020, which is hereby incorporated by reference herein in its entirety.

What is claimed is:

1. An apparatus comprising:
   a substrate including a first surface and a second surface opposed to the first surface;
   a first region of a first conductivity type disposed at a first depth from the first surface in the substrate, carriers having a conductivity type same as a conductivity type of signal carriers being used as major carriers in the first region;
   a second region of the first conductivity type disposed at the first depth in the substrate, the second region being separated from the first region;
   a third region of the first conductivity type disposed at a second depth in the substrate, the second depth being shallower than the first depth from the first surface;
   a first gate configured to control transfer of signal charges accumulated in the first region;
   a second gate configured to control transfer of signal charges accumulated in the second region;
   a third gate configured to control transfer of signal charges accumulated in the third region; and
   a microlens disposed such that light transmitted through the microlens is incident on the first region, the second region, and the third region,
   wherein the signal charges accumulated in the first region are read out through the third region, and
   wherein an impurity concentration of each of the first region and the second region is lower than an impurity concentration of the third region.

2. The apparatus according to claim 1,
   wherein the first region and the third region are disposed to overlap each other in a planar view, and
   wherein a height of a potential barrier between the first region and the second region with respect to carriers of the first conductivity type is higher than a height of a potential barrier between the first region and the third region.

3. The apparatus according to claim 1, further comprising a floating diffusion region,
   wherein signal charges generated in the second region are transferred to the floating diffusion region through the third region.

4. The apparatus according to claim 1,
   wherein the first region and the third region are disposed to overlap each other in a planar view, and
   wherein a region of a second conductivity type is disposed between the first region and the second region, and a region of the first conductivity type is disposed between the first region and the third region.

5. The apparatus according to claim 1, wherein the third gate is a flat gate.

6. The apparatus according to claim 5, wherein the first gate and the second gate are vertical gates.

7. The apparatus according to claim 1, wherein the third region is disposed to overlap each of the first region and the second region in a planar view.

8. The apparatus according to claim 7, wherein the third region is shared between the first region and the second region.

9. The apparatus according to claim 1, further comprising a fourth region of the first conductivity type disposed at the second depth, the fourth region being separated from the third region,
   wherein the third region is disposed to overlap the first region in a planar view, and
   wherein the fourth region is disposed to overlap the second region in a planar view.

10. The apparatus according to claim 9, further comprising a fifth region of the first conductivity type disposed between the first region and the third region, an impurity concentration of the fifth region being lower than an impurity concentration of each of the first region and the third region.

11. The apparatus according to claim 1, wherein the second surface is a light incident surface.

12. The apparatus according to claim 1, wherein focus detection by an imaging plane phase difference method is performed using a signal based on signal charges generated in the first region and a signal based on signal charges generated in the second region.

13. A method for an apparatus, the apparatus comprising:
    a substrate including a first surface and a second surface opposed to the first surface;
    a first region of a first conductivity type disposed at a first depth from the first surface in the substrate, carriers having a conductivity type same as a conductivity type of signal carriers being used as major carriers in the first region;
    a second region of the first conductivity type disposed at the first depth in the substrate;
    a third region of the first conductivity type disposed at a second depth in the substrate, the second depth being shallower than the first depth from the first surface;
    a floating diffusion region;
    a first gate configured to control transfer of signal charges accumulated in the first region;
    a second gate configured to control transfer of signal charges accumulated in the second region;
    a third gate configured to control transfer of signal charges accumulated in the third region; and
    a microlens disposed such that light transmitted through the microlens is incident on the first region and the second region, the method comprising:
    transferring, in a case where an amount of signal charges accumulated in the first region and an amount of signal charges accumulated in the second region are less than or equal to a predetermined value, the signal charges accumulated in the first region and the signal charges accumulated in the second region after the third gate is turned on to transfer the signal charges from the third region to the floating diffusion region.

14. The method according to claim 13, wherein a period in which the first gate is turned on partially overlaps a period in which the third gate is turned on.

15. The method according to claim 13, wherein in a case where at least one of the amount of signal charges accumulated in the first region and the amount of signal charges accumulated in the second region exceeds the predetermined value, the first gate is turned on, the second gate is turned on and reset, and the third gate is turned on.

16. The method according to claim 13, wherein signal charges generated in the first region are transferred to the floating diffusion region through the third region.

17. The method according to claim 16, wherein the first gate and the second gate are vertical gates.

18. A system comprising:
the apparatus according to claim 1; and
a processing unit configured to process a signal output from the apparatus.

19. A moving body comprising:
the apparatus according to claim 1;
an acquisition unit configured to acquire distance information about a distance to an object based on a signal output from the apparatus; and
a control unit configured to control the moving body based on the distance information.

* * * * *